United States Patent

Kikuchi

[11] Patent Number: 6,035,108
[45] Date of Patent: Mar. 7, 2000

[54] FIGURE LAYOUT COMPACTION METHOD AND COMPACTION DEVICE

[75] Inventor: Hideo Kikuchi, Tokyo, Japan

[73] Assignee: NEC Corporation, Tokyo, Japan

[21] Appl. No.: 08/953,506

[22] Filed: Oct. 17, 1997

[30] Foreign Application Priority Data

Oct. 17, 1996 [JP] Japan .................................. 8-274366
Feb. 27, 1997 [JP] Japan .................................. 9-044138

[51] Int. Cl.$^7$ ...................................................... G06F 17/50
[52] U.S. Cl. ................................ 395/500.03; 395/500.1; 395/500.13
[58] Field of Search ...................... 364/488, 489, 364/490, 491; 395/10, 133, 500.02, 500.03, 500.08, 500.9, 500.1, 500.11, 500.13, 500.14

[56] References Cited

U.S. PATENT DOCUMENTS

| 5,381,343 | 1/1995 | Bamji et al. .............................. 364/488 |
| 5,493,509 | 2/1996 | Matsumoto et al. ................. 395/500.03 |
| 5,535,134 | 7/1996 | Cohn et al. ............................... 364/491 |
| 5,625,568 | 4/1997 | Edwards et al. .................... 395/500.03 |
| 5,640,497 | 6/1997 | Woolbright .............................. 395/133 |
| 5,812,740 | 9/1998 | Scepanovic et al. ...................... 395/10 |
| 5,943,486 | 8/1999 | Fukui et al. .......................... 395/500.1 |

FOREIGN PATENT DOCUMENTS

| 1-279372 | 11/1989 | Japan . |
| 2-1655654 | 6/1990 | Japan . |
| 4-48750 | 2/1992 | Japan . |
| 4-151855 | 5/1992 | Japan . |

OTHER PUBLICATIONS

Valainis et al. "Two–Dimensional IC Layout Compaction Based on Topological Design Rule Checking," IEEE Transactions on Computer–Aided Design, vol. 9, No. 3, Mar. 1990.

Apanovich and Marchuk "DECOMP: A Technology Migration Subsystem for Full Chip Mask Layouts," IEEE, 1997.

Primary Examiner—Kevin J. Teska
Assistant Examiner—Leigh Marie Garbowski
Attorney, Agent, or Firm—Sughrue, Mion, Zinn, Macpeak & Seas, PLLC

[57] ABSTRACT

A layout amendment specification section includes an input means such as a mouse and gives instructions to an section for compacting within allowable spacing, a wiring compaction section, a rewiring section, and an allowable spacing calculation section. The layout amendment specification section produces vertical ranking data for elements of terminals, via-holes, and wiring divided by each bent point of the wiring route. The allowable spacing calculation section produces vertical and horizontal sequence data that places all elements in order vertically and horizontally, and moreover, calculates the allowable spacing between terminals and via-holes. Based on the allowable spacing data, section for compacting within allowable spacing shifts the terminals and via-holes by pushing them down, and in addition, shifting the terminals and via-holes while maintaining a spacing of a gap compensation amount wherever possible that can accommodate one wire between a terminal or via-hole and an adjacent element.

10 Claims, 20 Drawing Sheets

| ELEMENT NUMBER OF THE UPPER ELEMENT<br>ELEMENT NUMBER OF THE LOWER ELEMENT | 61 |
| --- | --- |
| ALLOWABLE SPACING (VERTICAL)<br>ALLOWABLE SPACING (HORIZONTAL)<br>ALLOWABLE SPACING (45-DEGREE DIAGONAL DIRECTION) | |
| ELEMENT NUMBER OF THE WIRING BETWEEN THE UPPER ELEMENT AND THE LOWER ELEMENT | (1) |
| ELEMENT NUMBER OF THE WIRING BETWEEN THE UPPER ELEMENT AND THE LOWER ELEMENT | (2) |
| ⋮ | |

FIG. 12b

| ELEMENT NUMBER OF SUB-ELEMENT NUMBER | 74 |
| --- | --- |
| ALLOWABLE SPACING (VERTICAL)<br>ALLOWABLE SPACING (HORIZONTAL)<br>ALLOWABLE SPACING (45-DEGREE DIAGONAL DIRECTION) | |

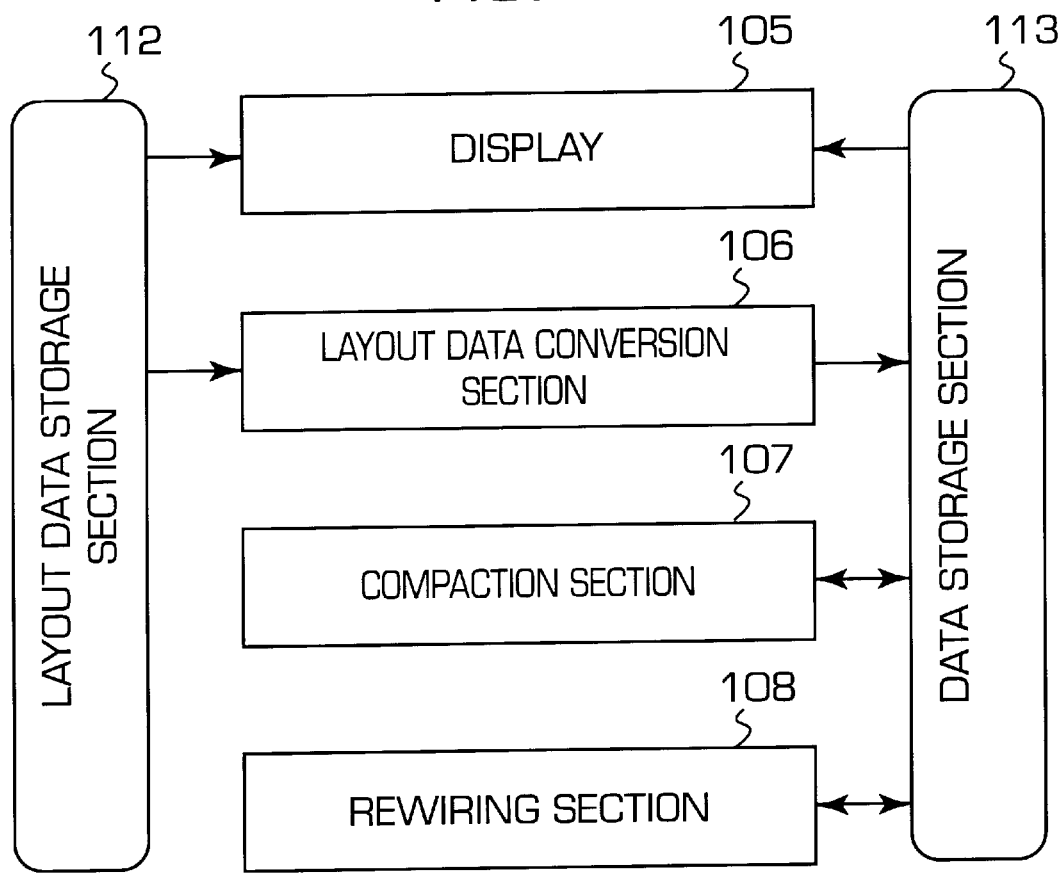

FIG. 17a

| ELEMENT NUMBER |
| --- |
| SHIFT AGGREGATE NUMBER |
| SHAPE NUMBER |
| COORDINATE VALUE |

| ELEMENT NUMBER |
| --- |
| SHIFT AGGREGATE NUMBER (THE FIRST END) |
| SHIFT AGGREGATE NUMBER (THE SECOND END) |
| SHAPE NUMBER |
| COORDINATE VALUE (THE FIRST END) |
| COORDINATE VALUE (THE SECOND END) |

| SHAPE NUMBER |
| --- |
| VERTICAL WIDTH VALUE |
| HORIZONTAL WIDTH VALUE |
| DIAGONAL WIDTH VALUE IN A 45-DEGREE DIRECTION TOWARD THE UPPER RIGHT |
| DIAGONAL WIDTH VALUE IN A 45-DEGREE DIRECTION TOWARD THE LOWER LEFT |

| |
|---|
| ELEMENT NUMBER |
| SHIFT AGGREGATE NUMBER (THE FIRST END) |
| SHIFT AGGREGATE NUMBER (THE SECOND END) |
| SHAPE NUMBER |
| COORDINATE VALUE (THE FIRST END) |
| COORDINATE VALUE (THE SECOND END) |
| THE STORAGE ADDRESS OF THE START OF THE GROUP OF SUB-ELEMENT |
| THE NUMBER OF THE SUB-ELEMENT DATA ITEMS |

| |
|---|
| SUB-ELEMENT NUMBER |
| SHIFT AGGREGATE NUMBER (THE FIRST END) |
| SHIFT AGGREGATE NUMBER (THE SECOND END) |
| SHAPE NUMBER |
| COORDINATE VALUE (THE FIRST END) |
| COORDINATE VALUE (THE SECOND END) |

145

FIGURE LAYOUT COMPACTION METHOD AND COMPACTION DEVICE

BACKGROUND OF THE INVENTION

1. Field of the Invention

The present invention relates to a figure layout compaction method and compaction device, and particularly to a figure layout compaction device and compaction method for such a device that performs compaction processing in component arrangement and wiring design for printed circuit boards and integrated circuits.

2. Description of the Related Art

Automatic layout devices are used in designing the layout of large-scale semiconductor integrated circuits and the layout of printed circuit boards, and various types of compaction techniques have been proposed for this type of layout device.

As a first example of the prior art, one known method is disclosed in "Design Modification Method for Semiconductor Integrated Circuits" of Japanese Patent Laid-open No. 165654/90. According to this method, when adding new wiring to an already existing layout, compaction separation lines and the region in their vicinity are specified and wiring already existing within this range is shifted to the periphery centering on compaction separation lines, thereby establishing a blank region having no wiring in the vicinity of compaction separation lines. New wiring may then be inserted in the blank region.

As a second example of the prior art, another known method is described in "LSI Layout Compaction Device" of Japanese Patent Laid-open No. 279373/89. The object of this invention is to efficiently discover modification portion which needs a modification process, reserve an area for the modification process, and to speedily execute the compaction process.

For this purpose, this LSI layout compaction device includes: a longest path search means for searching for the longest path made up of each figure element and wiring in a specified compaction direction for layout results representing the arrangement of figure elements representing each cell on an LSI chip and the wiring between each figure element; layout enlargement means for enlarging an blank region crossing this longest path in a direction opposite to the specified compaction direction; layout modification specification means for specifying that a portion of a figure element included in the longest path be shifted to this blank region; and compaction means for shifting a figure element specified by the layout modification specification means to an blank region and, after shifting, compacting the layout in the specified compaction direction.

As a third example of the prior art, another known method is disclosed in "Layout Compaction Device" of Japanese Patent Laid-open No. 151855/92. This device is provided with means for setting a compaction-prohibited area for block cells in every wiring layer, and means for compacting layout patterns based on the prohibited areas set by the prohibited area setting means.

In the compaction devices and compaction methods of the above-described prior art, wiring is compacted together through a compaction process by a means that compacts wiring, whereby wiring is arranged in a dense state with few gaps between wires. As a result, when new wiring is to be inserted, a compaction process must be executed to make a blank region for added wiring, as in the first prior-art method. Such methods have the drawback that a considerable amount of time is required by a compaction process for shifting the via-holes passing through multiple layers as well as the multiplicity of wiring in their vicinity.

As yet another method of the prior art, another known method is disclosed in "Compaction Method for Integrated Circuits" of Japanese Patent Laid-open No. 48750/92. This invention has the object of compacting the layout of each cell and wiring on an LSI chip into a smaller area. According to this invention, a component/wiring compaction means compacts the maximum limit of parts and horizontal/vertical wiring by arranging wires in horizontal and vertical directions into an arrangement area of the smallest dimensions, and then returns the position of via-holes that are connected to terminals as far as the positions of connecting terminals to form horizontal/vertical wiring.

In this prior-art compaction method, problems arise when diagonal lines exist in a pattern, as for example, when via-holes penetrating a plurality of layers are arranged in a row. In other words, in a case in which the first layer among a plurality of layers of patterns has a diagonal line that extends toward the upper right from below a via-hole on the left side to above a via-hole on the right side, the via-hole on the right side is judged to be below the via-hole on the left by way of the wiring; while conversely, if another layer has a diagonal line that extends toward the lower right from above the via-hole on the left side to below via-hole on the right side, the via-hole on the right side is judged to be above the via-hole on the left side by way of the wiring. Because this judgment contradicts the previous judgment, the vertical relationship of the left and right via-holes cannot be determined.

Furthermore, even in a single layer, in a case in which a polygon conductor shape having a concavity opening toward the right formed by a protruding side on the upper right and a protruding side on the lower right encloses a terminal within this concavity, this terminal is above the protrusion on the lower right of the polygonal conductor shape and at the same time below the protrusion on the upper right, resulting in the contradiction that the terminal is both above and below the polygonal conductor shape, whereby the vertical relationship between the polygonal conductor shape and the terminal cannot be determined.

In this way, compaction methods of the prior art have the drawback that the compaction process cannot be executed due to the inability to determine vertical relationships for patterns having diagonal wiring lines or polygonal conductor shapes.

SUMMARY OF THE INVENTION

The object of the present invention is to provide a figure layout compaction method and compaction device that does not require a large number of times for design modifications when adding wiring to an already existing layout.

Another object of the present invention is to provide a figure layout compaction method and compaction device that can compact patterns that include diagonal wiring lines and polygonal conductor shapes.

In the figure layout compaction device and compaction method of the present invention, a layout amendment specification means has an input means such as a mouse and gives commands to an means for compacting within allowable spacing; a wiring compaction means; rewiring means, and means for calculation of allowable spacing. The layout amendment specification means prepares vertical ranking data for elements of terminals, via-holes, and wiring that is disassembled by each bend of the wiring route. The allowable spacing calculation means prepares vertical and horizontal sequence data in which all elements are placed in order vertically or horizontally, and in addition, calculates the allowable spacing between terminals and via-holes. The means for compacting within allowable spacing pushes terminals and via-holes down based on the allowable spacing data, and moreover, wherever possible, shifts terminals and via-holes while maintaining with respect to adjacent elements the spacing of a gap compensation amount that can accommodate one wire.

Executing a compaction process to compact terminals or wiring while at the same time, whenever possible, arranging the spacing of terminals and via-holes so as to provide the margin of the gap compensation amount increases the probability of extra space for conducting wiring during subsequent wiring amendment, thereby allowing design of a layout that can be more easily modified at a later time.

The figure layout compaction device of the present invention divides terminals, via-holes, wiring, and polygonal conductor shapes into elements for each layer; attaches a common shift aggregate number to element data of these elements; calculates the vertical and horizontal ranking of these elements together; shifts each element independently for each layer surface; and, when shifting an element, updates the shift limits of the shift aggregate group to which it belongs. As a result, the vertical or horizontal relationship of patterns having diagonal lines can be defined without contradiction, thereby allowing a compaction process.

The above and other objects, features, and advantages of the present invention will become apparent from the following description with references to the accompanying drawings which illustrate examples of the present invention.

BRIEF DESCRIPTION OF THE DRAWINGS

FIGS. 12a and 12b show the data structure of each type of data in the second embodiment according to the present invention;

FIG. 14 is a block diagram showing the construction of the third embodiment according to the present invention;

FIGS. 17a, 17b, 17c show the data structures of each type of data in the third embodiment according to the present invention;

FIGS. 20a and 20b show the data structures of each type of data in the fourth embodiment according to the present invention.

DETAILED DESCRIPTION OF THE PREFERRED EMBODIMENTS (First Embodiment)

Figure 1:
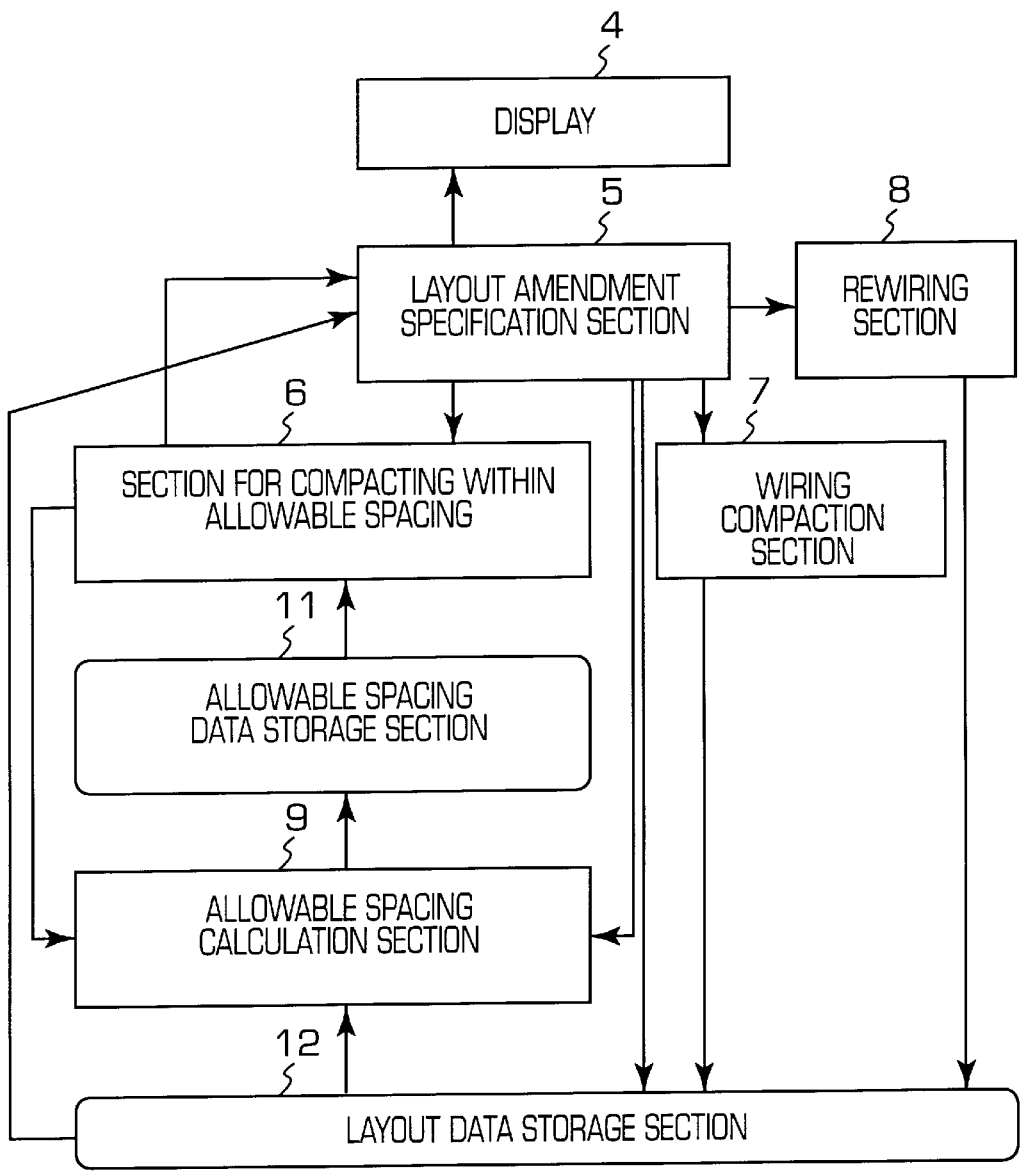
FIG. 1 is a block diagram showing the construction of a figure layout compaction device according to the first embodiment according to the present invention.

The first embodiment according to the present invention will first be described using FIG. 1 to FIG. 8. As shown in FIG. 1, the figure layout compaction device of this embodiment is made up of: display 4, layout amendment specification section 5, section 6 for compacting within allowable spacing, wiring compaction section 7, rewiring section 8, allowable spacing calculation section 9, allowable spacing data storage section 11, and layout data storage section 12.

Display 4 is made up of, for example, a CRT display or liquid crystal display, and is used for displaying an initial layout pattern, a layout pattern undergoing modification, a layout pattern following completion of modification, and layout data.

Layout amendment specification section 5 has an input section such as a console, mouse, or touch panel; and is a means for generating commands to display input results and amendment results on display 4 or commands to operate a prescribed functional section in response to input.

Functional units whose operation is directed by layout amendment specification section 5 include: section 6 for compacting within allowable spacing for terminals and via-holes, wiring compaction section 7, rewiring section 8, and allowable spacing calculation section 9.

Here, layout patterns are made up from terminals, via-holes, and wiring.

Figure 2A:
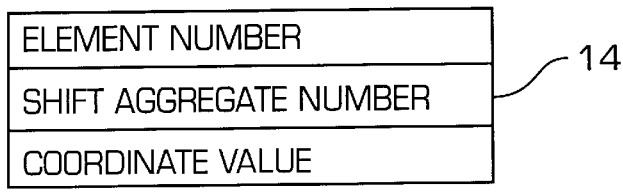
FIGS. 2a, 2b, 2c, and 2d each show the data structure of each type of data in the first embodiment according to the present invention.
Figure 2B:
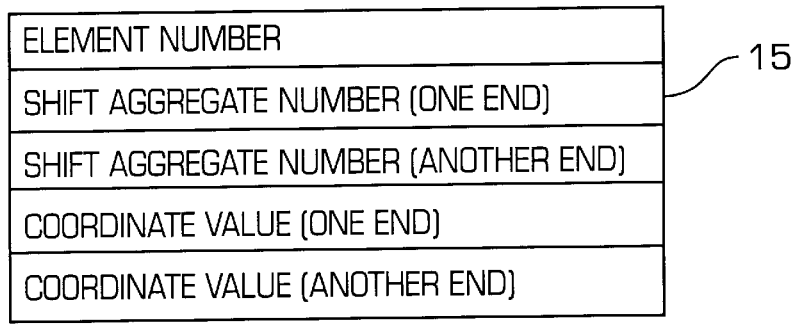

Layout amendment specification section 5 disassembles via-holes for every layer surfaces, disassembles wiring for every bent point and branch point of the wiring route, and produces element data taking as an element each of the terminals, disassembled via-holes, and disassembled wiring. FIG. 2a shows element data 14 for a terminal and disassembled via-hole, and FIG. 2b shows element data 15 for disassembled wiring.

A shift aggregate number and coordinate values are stored in element data 14 in addition to the element number.

The same shift aggregate number is applied to all elements of terminals common to one component, and the same number is applied to each element of a via-hole that has been disassembled into a separate element for each layer.

Elements bearing the same shift aggregate number are shifted as an assemblage, and therefore form a shift aggregate group.

Each shift aggregate number is then stored as shift aggregate data 22 together with a shift amount that indicates the amount of movement from the original position by the shift aggregate group bearing that shift aggregate number.

The coordinate values indicate the position at which an element is established.

The shift aggregate number and coordinate values of both ends of a wire are stored together with the element number in element data 15 of wiring. The same shift aggregate number as that of a terminal or via-hole to which the end of a wire is connected is stored in the shift aggregate number in this element data 15.

Figure 2C:
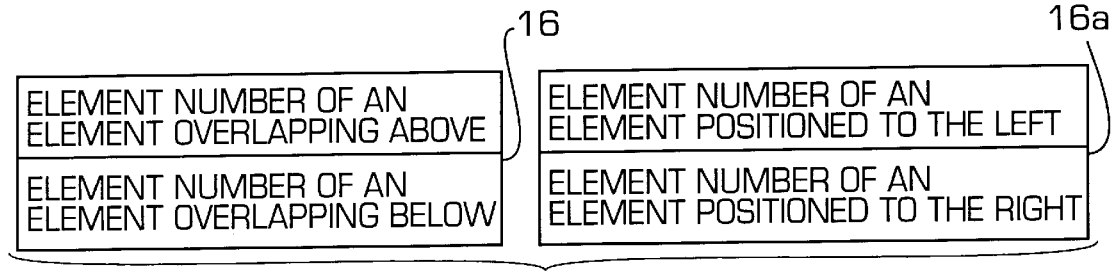
Figure 2D:
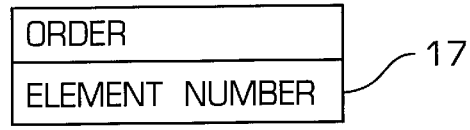

Layout amendment specification section 5 produces the vertical ranking data and horizontal ranking data of elements indicating the vertical and horizontal relationships for adjacent elements together as a group. FIG. 2c shows vertical ranking data 16 and horizontal ranking data 16a.

Vertical ranking data 16 is made up of the element number of a elements overlapping above and the element number of a elements overlapping below. Horizontal ranking data 16a is made up of the element number of a elements positioned to the left and the element number of a elements position to the right.

Here, vertical and horizontal represent positions on the same layer, one end being taken as "up," and do not indicate positional relationships on differing layers.

Figure 4A:
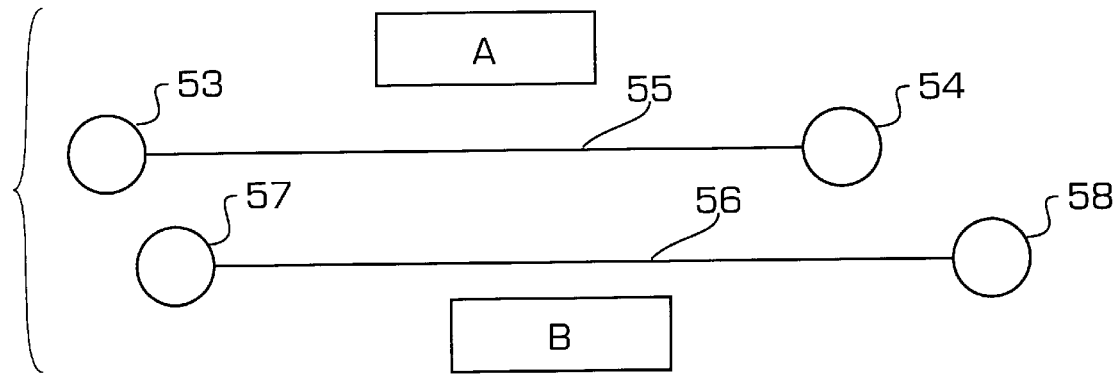
FIGS. 4a, 4b, and 4c illustrate the shift amount and the maximum limit of shifting used in the first embodiment according to the present invention.
Figure 4B:
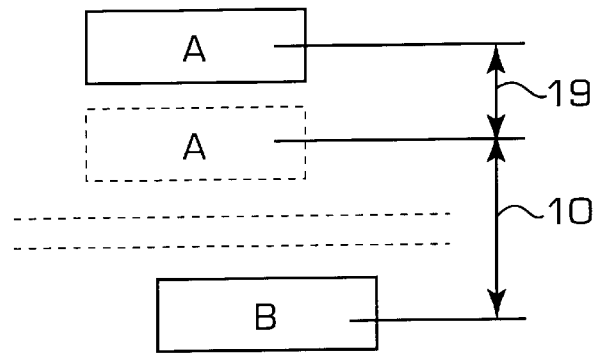
Figure 4C:
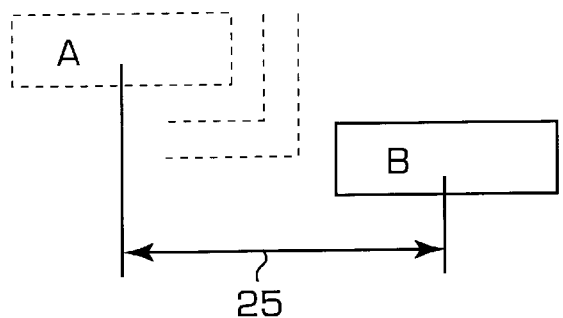

FIG. 4a shows a case in which two wires are interposed between upper terminal A and lower terminal B; and FIG. 4b shows in a broken line the position to which upper terminal A has been shifted, which is separated from lower terminal B by allowable spacing 10 in a vertical direction. FIG. 4c shows in a broken line the position to which upper terminal A has been moved which is separated from lower terminal B by allowable spacing 25 in a horizontal direction.

For the elements of terminals and via-holes, in a case in which the horizontal spacing between an upper element and a lower element falls short of the horizontal allowable spacing, i.e., when the upper element and lower element are vertically in overlapping positions, terminal/via-hole vertical ranking data 18 are used in place of the vertical ranking data 16 of FIG. 2c. This terminal/via-hole vertical ranking data 18 has the data structure shown in FIG. 3a, and additionally stores relative limit shift amount to the vertical ranking data 16.

The relative limit shift amount is a value obtained by subtracting the coordinate values in the vertical direction of the lower element from the coordinate values in the vertical direction of the overlaying element, and further subtracting the vertical allowable spacing.

The relation between this relative limit shift amount and allowable spacing is next explained with reference to FIGS. 4a, 4b, and 4c.

First, in FIG. 4a, wire 55 for connecting terminal 53 and terminal 54 and wire 56 for connecting terminal 57 and terminal 58 exist between elements A and B.

In a case in which element A cannot be moved below the position shown by the broken line with respect to element B as shown in FIG. 4b, the distance between element A and element B at this time is the vertical allowable spacing 10. The relative limit shift amount 19 is the vertical allowable spacing 10 subtracted from the distance between element B and the original position of element A.

Essentially, when calculating allowable spacing 10 as shown in FIG. 4b for elements A and B in the positional relation of FIG. 4a, relative limit shift amount 19 is as shown in FIG. 4b.

FIG. 4c shows horizontal allowable spacing 25 of element A and element B.

Allowable spacing calculation section 9 operates in accordance with instructions of layout amendment specification section 5; produces vertical sequence data 17 that place all elements in vertical order using vertical ranking data 16; calculates the allowable spacing between a terminal and via-hole and adjacent terminals and via-holes; and stores this result as allowable spacing data of terminals and via-holes in allowable spacing data storage section 11.

Based on the allowable spacing data of terminals and via-holes, section 6 for compacting within allowable spacing shifts the positions of terminals and via-holes by pushing down (or up) or by pushing to the right (or to the left). After having shifted these elements, section 6 for compacting within allowable spacing then activates allowable spacing calculation section 9 to update the allowable spacing data. This operation by allowable spacing calculation section 9 and section 6 for compacting within allowable spacing is repeated a plurality of times.

If a margin exists in the space between adjacent terminals and via-holes, section 6 for compacting within allowable spacing shifts terminals and via-holes other than terminals and via-holes whose positions have already been specified to positions having a margin equal to a "gap compensation amount." Here, the gap compensation amount is an amount of spacing that would accommodate the passage of one extra wire, i.e., an amount equal to a wire width plus the additional necessary spacing between the wire and other elements.

The new terminal and via-hole layout data produced by section 6 for compacting within allowable spacing is stored in layout data storage section 12 by way of layout amendment specification section 5.

After determining the arrangement of terminals and via-holes, wiring compaction section 7 carries out the compaction work by compacting wiring down (or up) and to the left (or to the right), and storing the positions as limit position data.

Following compaction by wiring compaction section 7, rewiring section 8 relocates wiring in a blank region between a position determined by wiring limit position data and a position separated by the allowable spacing from an element positioned at the side opposite the direction of compaction. In addition, in cases in which compaction work is not performed by wiring compaction section 7, rewiring section 8 arranges wiring at a position separated from adjacent elements by at least the allowable spacing.

Explanation will next be presented regarding the operation of the present embodiment.

Figure 5:
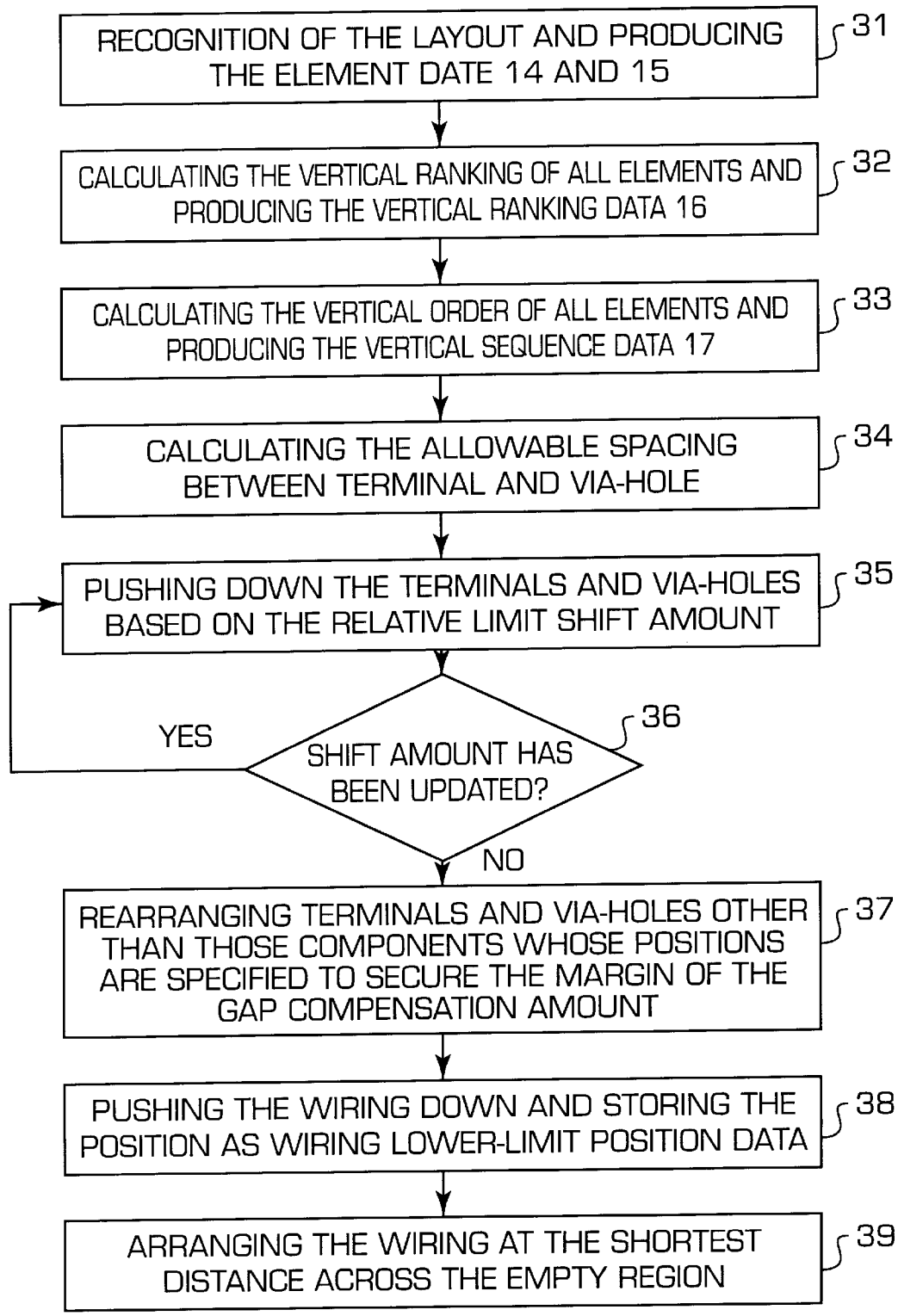
FIG. 5 is a flow chart showing the procedures in the first embodiment according to the present invention.
Figure 6C:
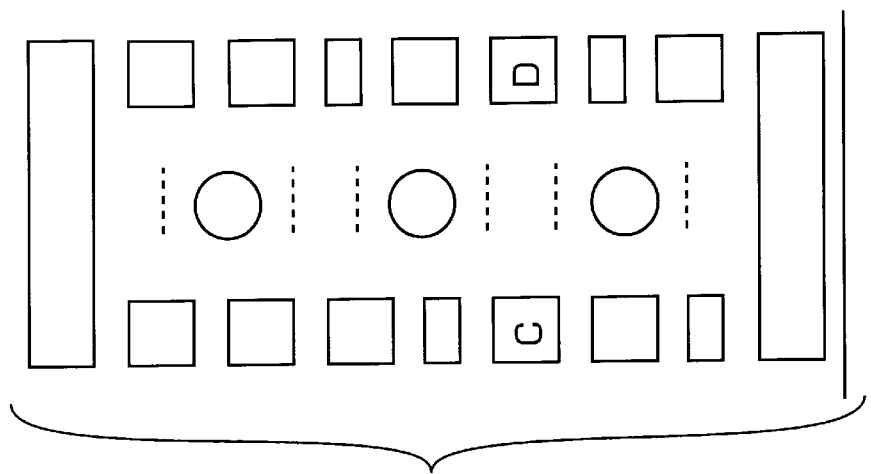
FIGS. 6a, 6b, and 6c show layout patterns for illustrating a concrete example of the procedures in the first embodiment according to the present invention.

FIG. 5 is a flow chart showing the overall procedures of the compaction process relating to the present embodiment. FIGS. 6a, 6b, and 6c, and FIGS. 7a, 7b, and 7c are plan views showing schematic figures of actual pattern layouts for the purpose of illustrating the operation of the present embodiment. FIG. 6a shows the initial layout of a printed circuit board, which is the object of the process of this embodiment. FIGS. 7b and 7c are plan views showing the state of the layout following completion of processing by the present embodiment.

The operation of the compaction process on the layout of FIG. 6a by the figure layout compaction device of the present embodiment is explained in the order of procedures of the flow chart of FIG. 5.

In this embodiment, wire 24 for connecting terminal C and terminal D is inserted after the completion of the compaction process.

In this embodiment, the initial layout on a printed circuit board may be arranged such that the gap between wiring, terminals, and via-holes and other adjacent wiring, terminals, and via-holes does not meet the minimum gap set by the design rules, because a gap that is equal to or less than the minimum dimensions of the design rules is corrected in the processes of the present embodiment.

Layout amendment specification section 5 first carries out layout recognition for layout data stored in layout data storage section 12 as described hereinafter and produces element data 14 and 15 (Step 31). For example, in FIG. 6a, element numbers are assigned to each of terminal elements 1a, 1b, ..., wiring elements 2a, 2b, ..., via-hole elements 3a, and so on.

Next, layout amendment specification section 5 searches for an element that vertically overlaps (here, "vertically" means up or down on the page surface in, for example, FIG. 4 and does not indicate a direction perpendicular to the page surface) an element, and produces element vertical ranking data 16 that store the element number of the overlapping element and the element number of the lower element (Step 32).

For example, in FIG. 6a, terminal element 1a is assigned vertical ranking between terminal element 1b and terminal element 1c; and wiring element 2a is assigned vertical ranking between terminal element 1a, wiring elements 2b, 2c, 2d, 2e, and 2f, and via-hole element 3a. Border line X positioned at the lowest position of the region in which these elements are arranged is stored at the least significant bit of element vertical ranking data 16. This border line X may for example indicate the edge portion of the printed circuit board.

Element horizontal ranking data 16a are similarly produced for the horizontal direction. In this embodiment, the same process is carried out for the horizontal direction as for the vertical direction. Although the following explanation focuses on the processes for the vertical direction for the sake of simplifying the explanation, similar processes are also carried out for the horizontal direction.

Next, allowable spacing calculation section 9 produces vertical sequence data 17 using a network structure produced by element vertical ranking data 16 (Step 33). In the case of FIG. 6a, this vertical sequence data 17 assigns an order from the bottom up: terminal 1j, terminal 1h, wire 2o, wire 2n, wire 2m, terminal 1i, via-hole 3c, terminal 1f, and so on. Moreover, this ordering is not uniquely determined. For example, the ordering of terminal 1i may be made second instead of sixth, in which case succeeding elements are then ordered third, fourth, and so on toward the left.

Allowable spacing calculation section 9 then searches each element, to which ranking has been assigned in accordance with element vertical ranking data 16, from elements of lower ranking toward elements of higher ranking, taking a terminal or via-hole element as a starting point. Meanwhile, wiring that has been passed while conducting the search is stored. Allowable spacing calculation section 9 finds allowable spacing in the vertical direction of wiring elements and elements positioned above and below these wiring elements by calculating the sum of the width of wiring that has been gone through, the size of elements positioned above or below this wiring, and the minimum gap required between wiring and these elements. In addition, allowable spacing calculation section 9 similarly finds the horizontal allowable spacing and the allowable spacing in a 45-degree diagonal direction.

In this process, if a terminal element or a via-hole element exists for which the horizontal spacing of an upper element and lower element falls short of the horizontal allowable spacing, the relative limit shift amount is added to the element vertical ranking data 16 of the element to become terminal/via-hole vertical ranking data 18 (Step 34).

Section 6 for compacting within allowable spacing next carries out the compaction process for only terminals and via-holes and not for wiring by means of the processing from Step 35 to Step 37 below.

Figure 3A:
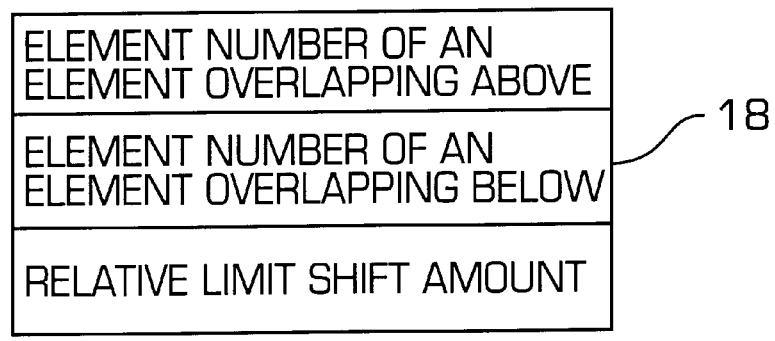
FIGS. 3a and 3b each show the data structure of each type of data in the first embodiment according to the present invention.
Figure 3B:
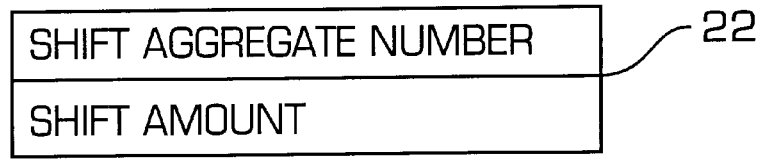

Section 6 for compacting within allowable spacing first fixes the position of border line X of a region in which an element is arranged, fixes to a specified value the shift amount of the shift aggregate groups to which the terminals of components whose positions are specified belong, and sets infinity, which is the initial value, as the shift amount for other components and via-holes. Section 6 for compacting within allowable spacing then stores this shift amount in shift aggregate data 22, for which the data structure is shown in FIG. 3b.

Section 6 for compacting within allowable spacing next selects terminal and via-hole elements as the element to be processed one by one in order from the low elements to the high elements of the sequence stored in element vertical sequence data 17, and carries out arrangement processing by the following procedure.

Section 6 for compacting within-allowable spacing first extracts terminal/via-hole vertical ranking data 18 that includes the element being processed as an upper element, and makes the value obtained by adding the relative limit shift amount to the shift amount stored in shift aggregate data 22 corresponding to the lower element the maximum limit shift amount of the element being processed. In an example shown in FIG. 8 in which element A is the element being processed, when conferring the shift amount 21 of shift aggregate data 22 corresponding to the lower element B as shown in the figure, the maximum limit shift amount 20 of the shift aggregate groups to which element A belongs can be found from the following formula (1):

$$\text{maximum limit shift amount} = \text{relative limit shift amount} + \text{shift amount} \quad (1)$$

In cases in which this maximum limit shift amount falls short of the shift amount stored in shift aggregate data 22 possessed by shift aggregate groups to which the element being processed belongs, this maximum limit shift amount is newly stored to shift aggregate data 22 as the shift amount. According to this process, the shift amount of an element having a fixed position is not updated, but the shift amounts of other elements are sequentially updated to smaller values from infinity, which is the initial value (Step 35).

After carrying out this process for all elements in order from elements having a low rank to elements having a high rank, i.e., after carrying out Step 35, section 6 for compacting within allowable spacing checks to confirm if any shift aggregate data 22 exist for which the shift amount has been updated (Step 36).

If updated shift aggregate data 22 exist, the process of Step 35 is again repeated, and the arrangement process is thus carried out by pushing down terminals and via-holes by repeating the processes of Steps 35 and 36 a plurality of times. If the shift amounts of shift aggregate data 22 have stopped being updated, the shift amounts of all shift aggregate groups are updated to appropriate values.

Figure 6B:
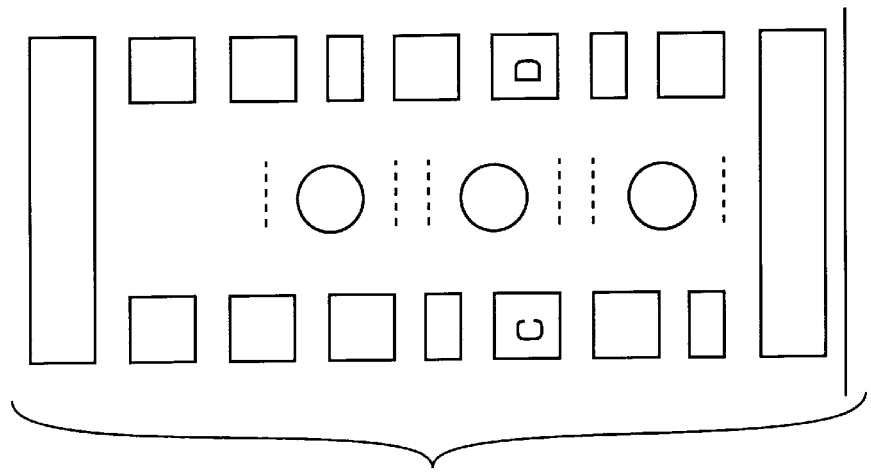
Figure 6A:
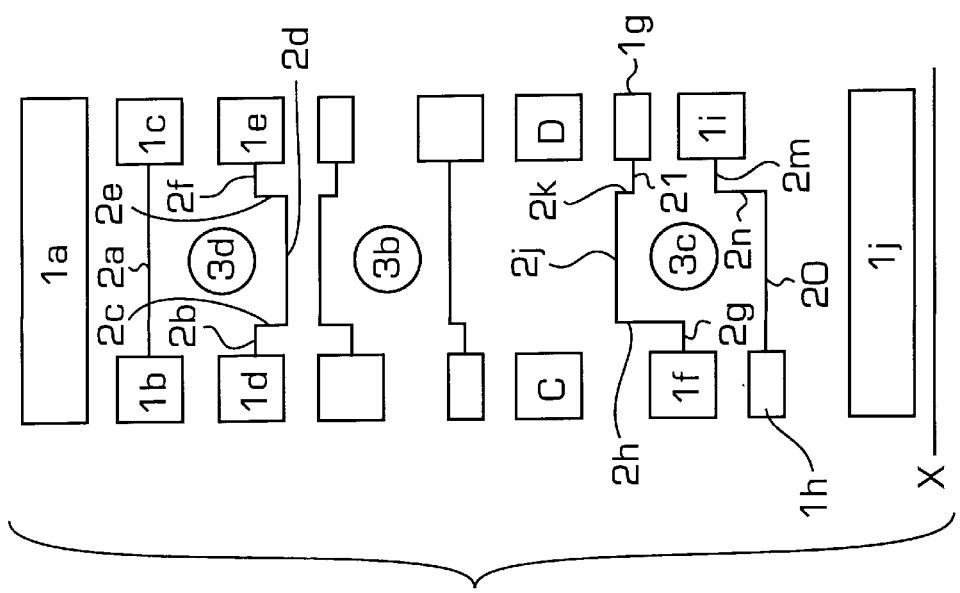
Figure 7C:
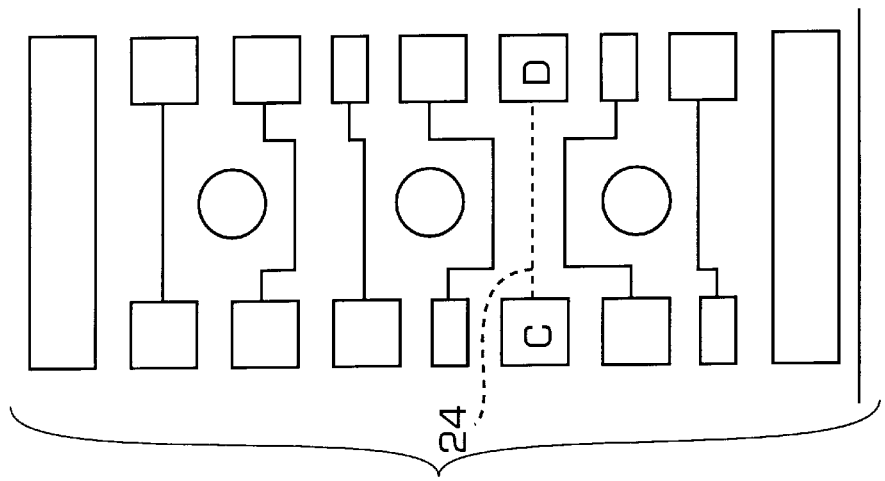
FIGS. 7a, 7b, and 7c show layout patterns for illustrating a concrete example of the-procedures in the first embodiment according to the present invention.
Figure 7B:
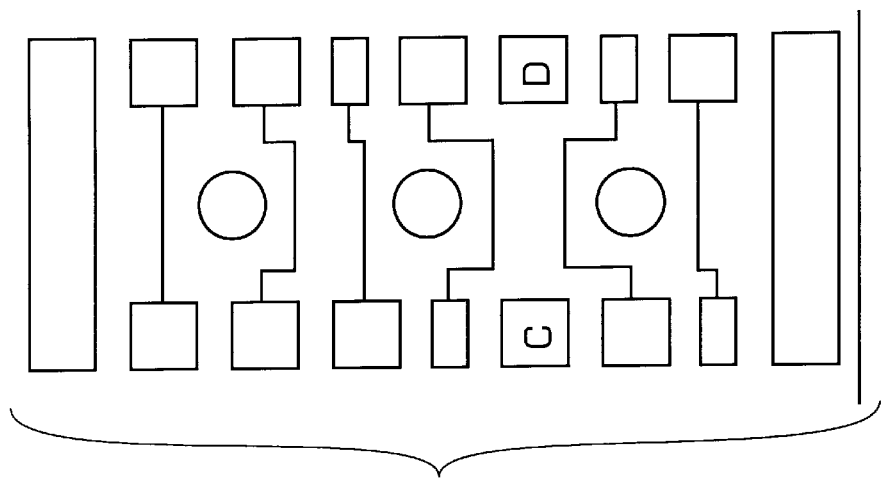

FIG. 6b shows the result of shifting and arranging the terminals and via-holes of the layout pattern of FIG. 6a by the above-described procedures. In FIG. 6b, the positions of terminals or via-holes are defined, but the wiring at this stage exists only as connection information and therefore is represented by broken lines.

Section 6 for compacting within allowable spacing then rearranges terminals and via-holes other than those components whose positions are specified in the following manner. Here, position specification, in which positions are fixed at positions obtained in Step 36, may also be carried out for components whose positions are not specified (Step 37).

In Step 37, section 6 for compacting within allowable spacing first sets the shift amounts of shift aggregate groups of elements other than elements of parts whose positions have been specified to arbitrary initial values which are equal to or less than values obtained in Step 35. Section 6 for compacting within allowable spacing next selects as the elements to be processed the elements of terminals and via-holes of parts whose positions have not been specified in order from elements having a high rank in element vertical sequence data 17 to elements having a low rank. Section 6 for compacting within allowable spacing then extracts terminal/via-hole vertical ranking data 18 corresponding to these elements being processed and rearranges these elements so as to meet the priority conditions described hereinafter.

First Priority: If the element being processed is a lower element in terminal/via-hole vertical ranking data 18, the shift amount of the shift aggregate groups must be a value equal to or greater than the value obtained by subtracting the relative limit shift amount from the shift amount of upper elements.

Second Priority: If the element being processed is an supper element in terminal/via-hole vertical ranking data 18, the shift amounts of the shift aggregate groups to which the element being processed belongs must be equal to or less than the maximum limit shift amount. In other words, the shift amounts of the shift aggregate groups must be equal to or less than the value obtained by adding the relative limit shift amount to either the initial value of lower elements or subsequently determined shift amounts.

Third Priority: If the element being processed is a lower element in terminal/via-hole vertical ranking data 18, the shift amount of the shift aggregate groups must be equal to or greater than a value obtained by subtracting the relative limit shift amount from the shift amount of the upper elements and adding the gap compensation amount. This gap compensation amount is set by the sum of the wiring width and the minimum required spacing between wires. On normal printed circuit boards, this value is either 0.3175 mm or 0.508 mm.

Fourth Priority: If the element being processed is an upper element in terminal/via-hole vertical ranking data 18, the shift amounts of the shift aggregate groups to which the element being processed belongs must be equal to or less than a value obtained by adding the relative limit shift amount to the shift amounts of the shift aggregate groups of lower elements and subtracting the gap compensation amount.

The priority of the above-described conditions is set by their order. The first priority must always be satisfied, but the other conditions need not necessarily be met. If the first priority can be met but the second priority on down cannot, the shift amounts of the shift aggregate groups to which the element being processed belongs are selected so as to approach as closely as possible the conditions of the second priority. Similarly, if the first and second priorities are satisfied but the third priority and on down cannot be met, the shift amounts of the shift aggregate groups to which the element being processed belongs are selected so as to approach the condition of the third priority as closely as possible. When all of the priorities are met, the shift amounts may be set to any value within the range of the conditions.

As a result, in a case in which the conditions of the second priority cannot be satisfied, Step 37 is repeated continuously until the conditions of the second priority are met.

The terminals and via-holes of a part are thus arranged so as to secure the margin of the gaps of the gap compensation amount as shown in FIG. 6c.

Figure 7A:
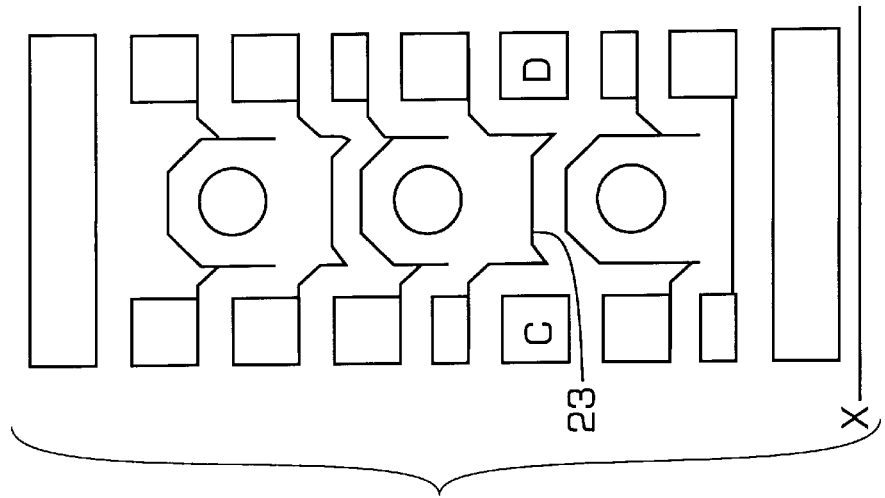
Figure 8:
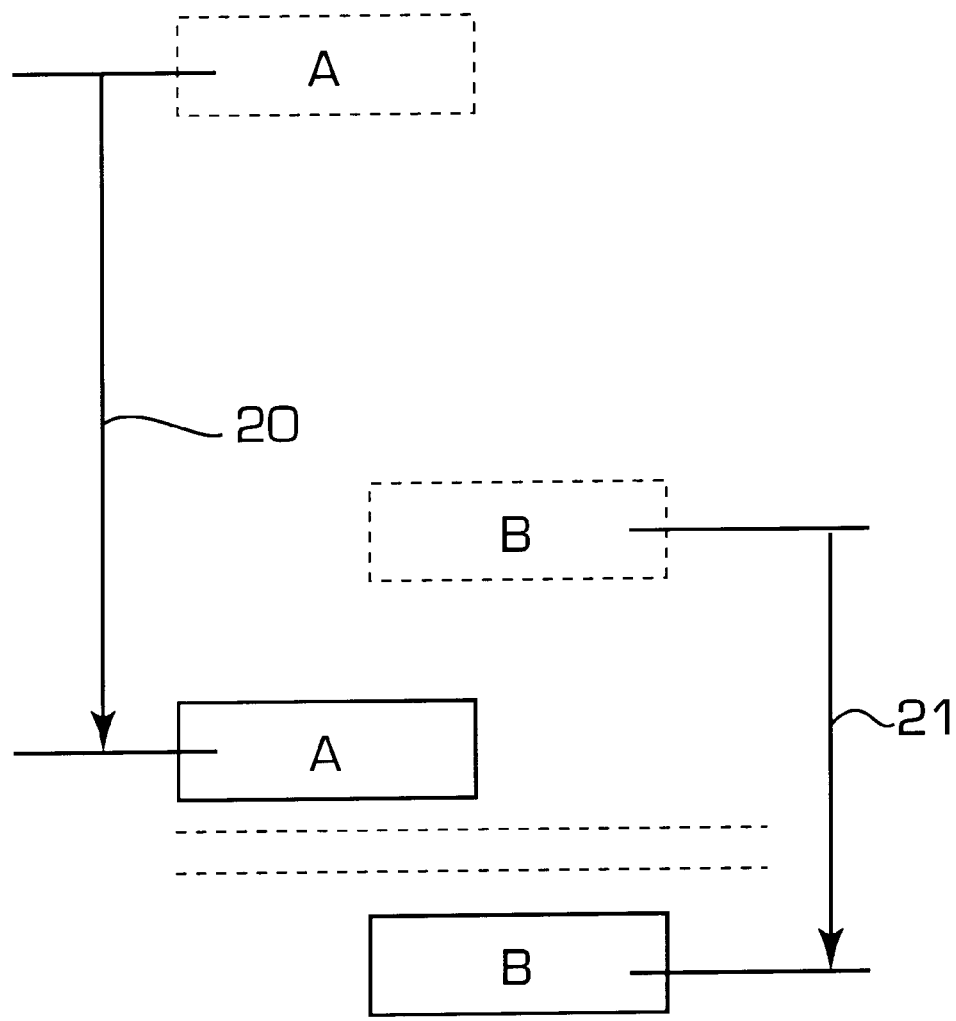
FIG. 8 shows the allowable spacing used in the first embodiment according to the present invention.

After the positions of terminals and via-holes have been defined, wiring compaction section 7 next arranges wiring in order from elements having a low rank in element vertical sequence data 17 to elements having a high rank. Wiring compaction section 7 here arranges by pushing the wiring down and storing the position as wiring lower-limit position data (Step 38). Wire 23 in FIG. 7a is an example of a case in which this wiring lower-limit position data is represented as actual wiring.

Rewiring section 8 next selects wiring elements as the elements to be processed in order from elements having a high rank in element vertical sequence data 17 to elements having a low rank, and arranges the elements according to the following method. Essentially, rewiring section 8 extracts element vertical ranking data 16 for elements having the element being processed as a lower element and reads the position of the upper element. Rewiring section 8 also reads the wiring lower-limit position data of the element being processed and arranges the wiring at the shortest distance across the blank region between a position separated from the upper element by the allowable spacing and a position stipulated by the wiring lower-limit position data (Step 39). The layout of FIG. 7b shows the wiring resulting from processing by this method.

In a case in which the need arises to add a new wire 24 linking terminal C and terminal D to the layout shown in FIG. 7b produced as described in the foregoing explanation, a new wire 24 can be inserted without shifting other via-holes or wiring as shown in FIG. 6c.

The example used in FIGS. 6a, 6b, 6c, and FIGS. 7a, 7b, 7c is a simple pattern, but even in a more complex case, a layout formed by the above-described procedures includes the margin of the gap compensation amount, and therefore allows the addition of new wires without shifting already formed terminals or via-holes. Moreover, shifting of already formed terminals or via-holes merely entails a layout modification in which the wiring of one portion of a layer is shifted to insert new wiring.

In this embodiment, the layouts which are the processing results of each step can be displayed on display 4, but the initial layout may also be formed by an automatic arranging/wiring section, Step 31 to Step 39 executed without displaying the content, and only the result displayed on display 4.

(Second Embodiment)

Explanation will next be presented regarding the second embodiment according to the present invention. Reference numerals coinciding with numbers used in FIG. 1, FIGS. 2a, 2b, 2c, and FIGS. 3a and 3b indicate equivalent constituent elements.

This embodiment is a means of shortening the processing time needed for calculating the position of arrangement of an element in cases in which an element is to be added to an already existing layout or when the position of an element is to be modified.

The figure layout compaction device of this embodiment has a construction that is equivalent to the figure layout compaction device of the first embodiment shown in FIG. 1.

Figure 9:
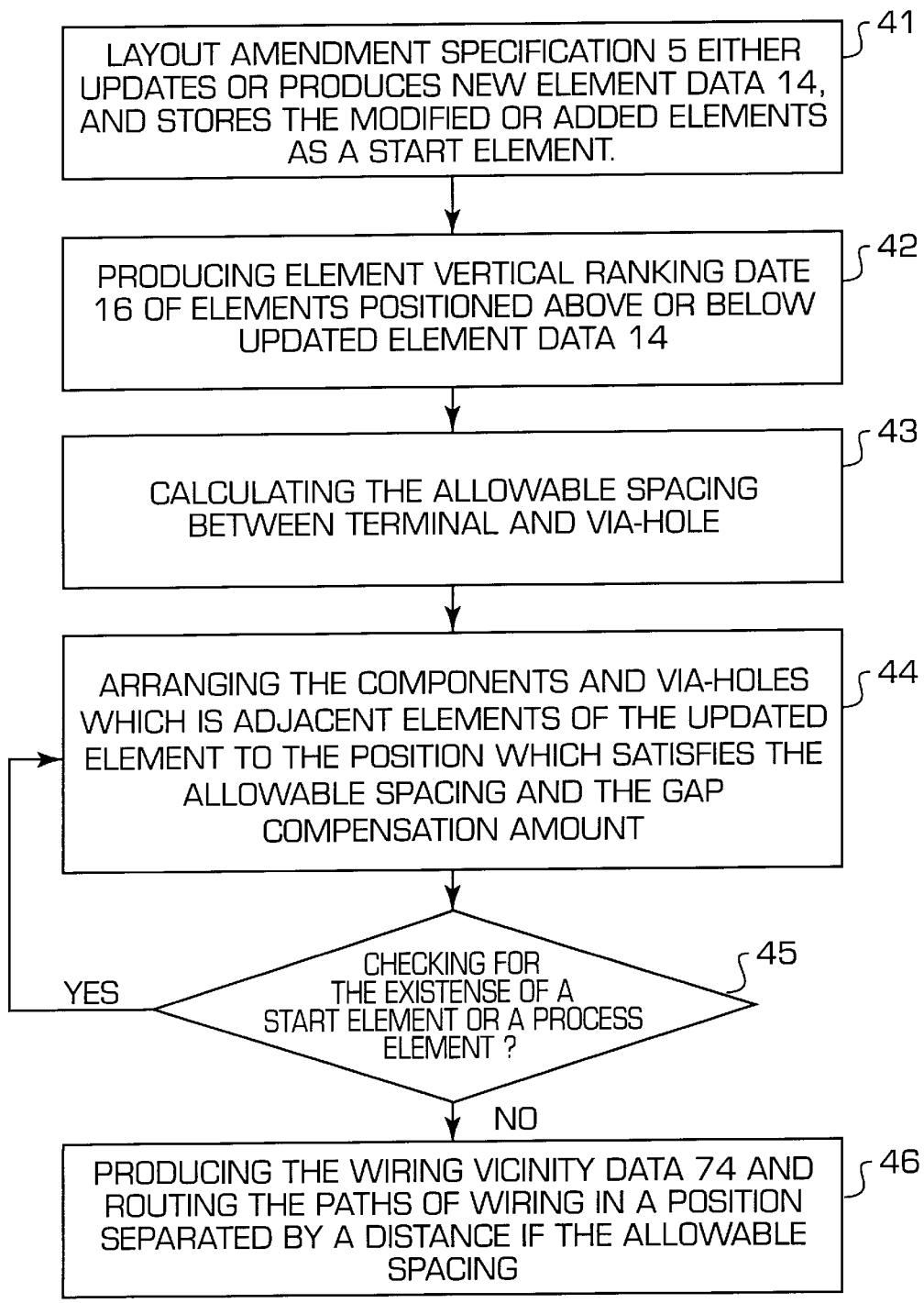
FIG. 9 is a flow chart showing the procedures in the second embodiment according to the present invention.

The operation of this embodiment will next be explained using the flow chart of FIG. 9.

Layout amendment specification section 5 first receives from the operator a command to shift a terminal or via-hole or to add a terminal, via-hole, or wiring of a part. In accordance with this command, layout amendment specification section 5 either updates or produces new element data 14 of the layout. Layout amendment specification section 5 then stores the modified or added element as a start element (Step 41).

Figure 10C:
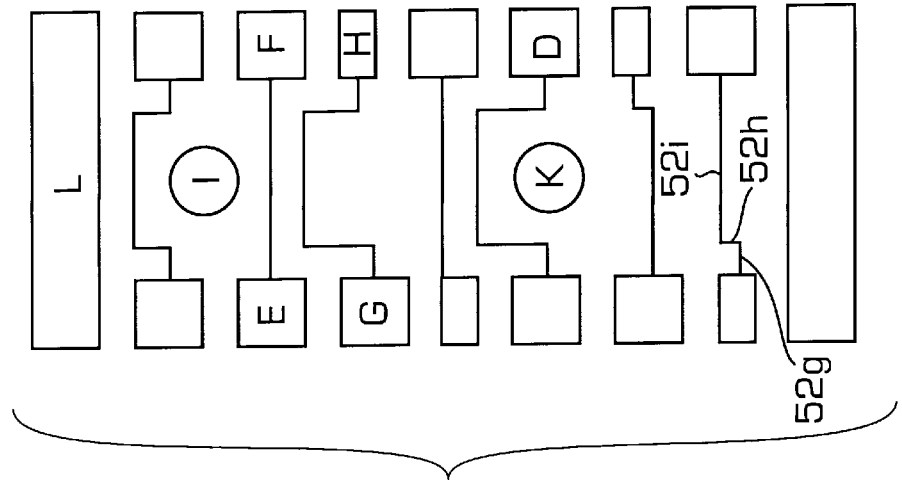
FIGS. 10a, 10b, and 10c show layout patterns for illustrating a concrete example of the procedures in the second embodiment according to the present invention.
Figure 10B:
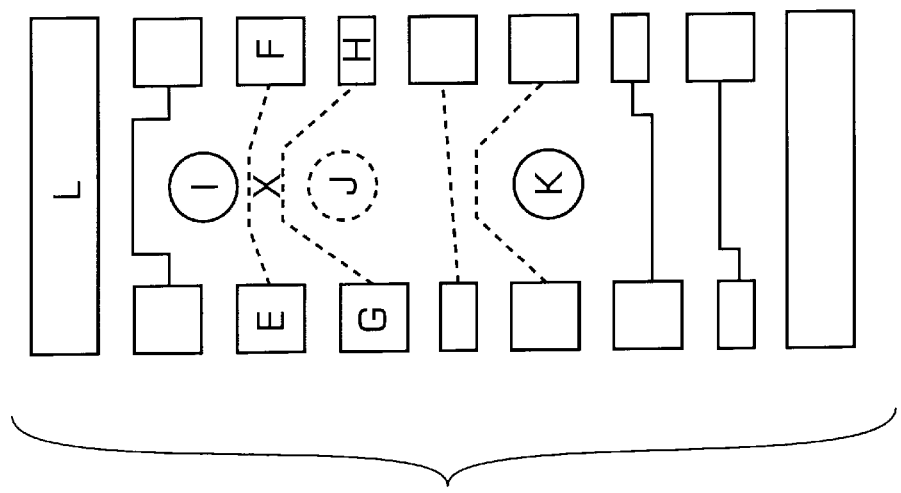
Figure 10A:
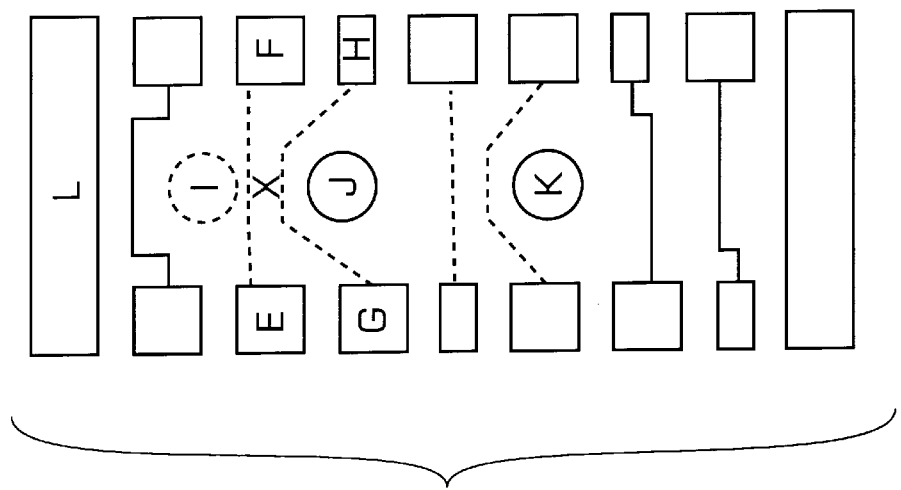

For the sake of explanation, an example will be used in which via-hole J is to be added to the initial layout shown in FIG. 10a. In this example, via-hole J is stored as the start element.

Figure 13A:
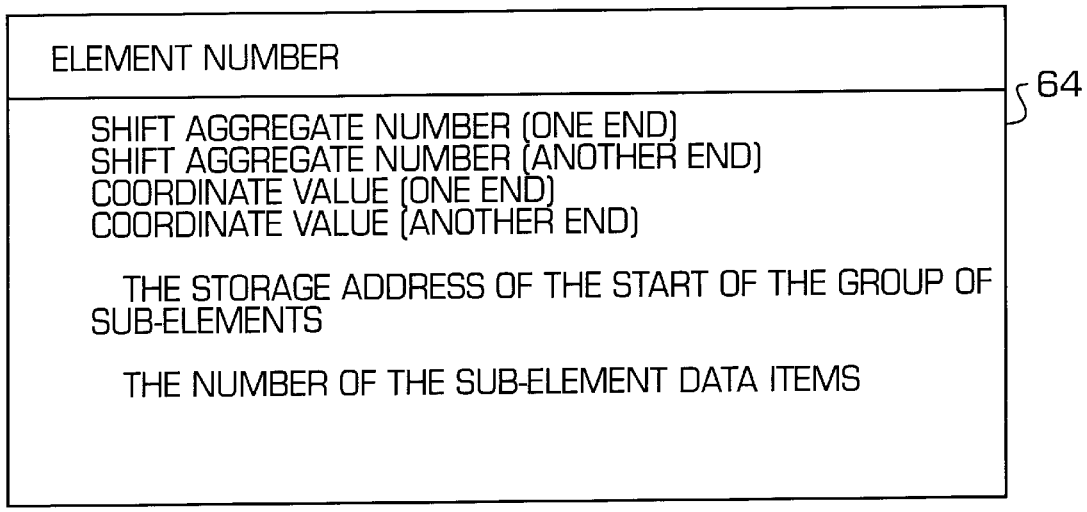
FIGS. 13a, 13b, and 13c show the data structure of each type of data in the second embodiment according to the present invention.
Figure 13B:
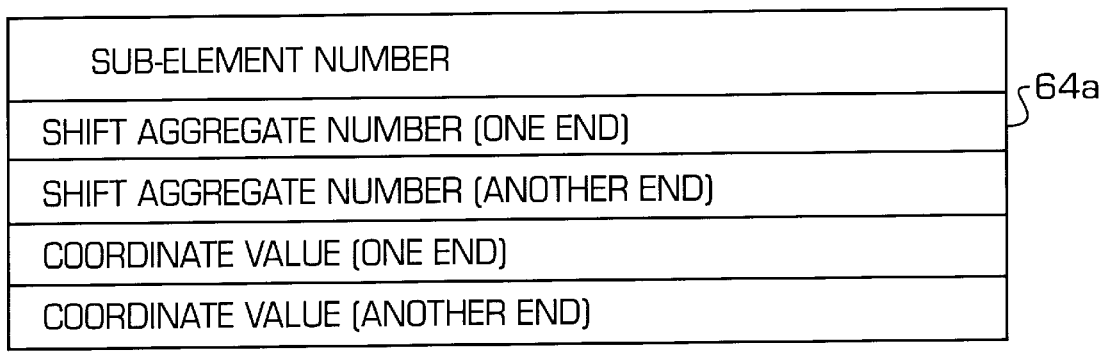

Element data 14 for terminals and via-holes is produced with the same data structure shown in FIG. 2a in the first embodiment, but element data for wiring is produced as element data 64 and sub-element data 64a shown in FIGS. 13a and 13b. This sub-element data 64a has a data structure equivalent to that of element data 14 shown in FIG. 2a. A sub-element is the division of wiring at a bent or a branch point of the wiring route and is equivalent to an element in the first embodiment. An element in this embodiment is one link of each wire that extends as far as a branch point or as far as a connection point with a via-hole or terminal. In FIG. 10a, for example, the lowermost wire is divided into three sub-elements 52g, 52h, and 52i, all of which together constitute one element. As shown in FIG. 13a, the storage address of the start of the group of sub-elements that constitute this element and the number of sub-element data items are stored in element data 64.

Figure 13C:
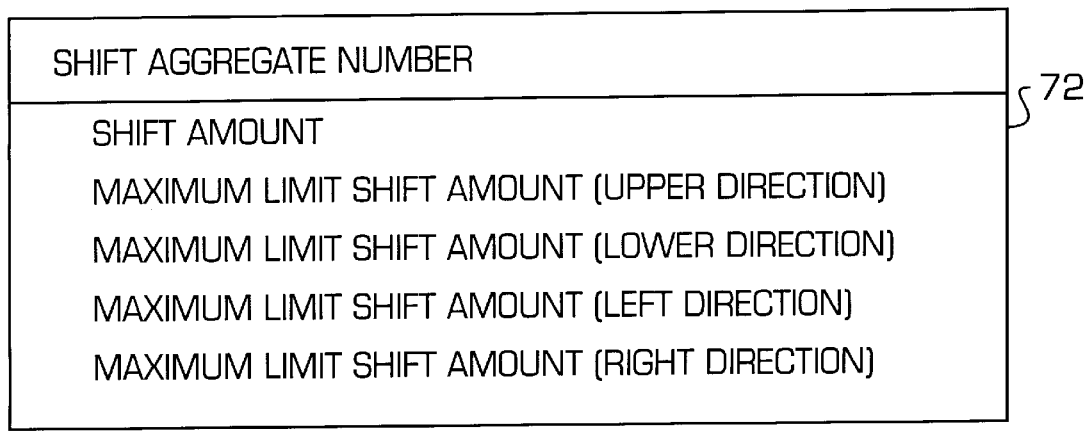

In addition, the same shift aggregate number is stored in element data 64 of elements connected to a terminal or via-hole that is altered by the addition of a new element, and elements having the same shift aggregate number are ultimately shifted by the same shift amount. As shown in FIG. 13c, the data structure of this shift aggregate data 72 stores the shift aggregate number, the shift amount, and each maximum limit shift amount in the vertical and horizontal directions.

As in Step 32 of the first embodiment, layout amendment specification section 5 searches for elements positioned above or below updated element data 14 and produces element vertical ranking data 16 (Step 42).

Allowable spacing calculation section 9 next searches for terminal 1 or via-hole 3 existing above or below in order from elements having a high rank to elements having a low rank with the element that modifies or adds to the network structure produced by element vertical ranking data 16 as the starting point. Then, as in Step 34 of the first embodiment, Allowable spacing calculation section 9 calculates the vertical allowable spacing, the horizontal allowable spacing, and the allowable spacing in a 45-degree diagonal direction between the elements of a via-hole or terminal positioned above or below that element. The element number of the upper element, the element number of the lower element, each allowable spacing, and the element numbers of wiring sandwiched between the element above and the element below are stored in allowable spacing data 61 having the data structure shown in FIG. 12a. Here, in cases in which wiring is newly added, allowable spacing data 61 is produced anew for storing the allowable spacing of elements that are together enclosed between this wiring.

If allowable spacing data exists which stores the allowable spacing of elements that together enclose between them newly added wiring, the prior allowable spacing is amended to a value obtained by adding the width and necessary gap of the added wiring.

Allowable spacing calculation section 9 then adds the element number of the added wiring to the element number list of a wiring element interposed between an upper element and lower element, this list being stored in allowable spacing data 61.

For elements to which the start element has been added and which are closer to elements that are adjacent to the start element than the necessary minimum spacing, allowable spacing calculation section 9 stores as modification elements the element numbers of wiring that runs between the start element and the elements of terminals or via-holes adjacent to the start element. If the start element is an element to be modified, element data 64 of the newly added wiring stores the sub-element data as undefined. If a shifted element is taken as the start element, the element number of wiring between the start element and the elements of terminals or via-holes positioned in the direction in which elements are shifted is stored as the element to be modified.

In a case in which via-hole J is inserted as shown in FIG. 10b, the wire that connects terminal E and terminal F, the wire that connects terminal G and terminal H that fall between via-holes I and K, and the two wires that fall between via-holes J and K are taken as the elements to be modified. Wiring stored as elements to be modified are shown in FIG. 10b by broken lines. As in a case in which the necessity arises for a particular element to be shifted in subsequent processing, allowable spacing calculation section 9 stores the wiring element numbers stored in the allowable spacing data 61 relating to this element as elements to be modified (Step 43).

Section 6 for compacting within allowable spacing then selects terminals or via-holes as the element to be processed according to the following priorities and carries out the processing described hereinafter.

First Priority:, If there is a terminal or via-hole stored as the start element, this element is selected as the element to be processed. The registration of the start element is reset following completion of the selection process of an element for processing. If the start element is wiring, terminals or via-holes of allowable spacing data 61 that include this wiring as an element are selected as the elements to be processed.

Second Priority: If there is an element that is reserved for processing, this element is selected as the element to be processed. This process reservation is reset following completion of the selection process of an element for processing.

Allowable spacing calculation section 9 extracts allowable spacing data 61 that includes the element number of this element being processed as an upper element number or a lower element number, and selects the elements of the other element numbers stored together with the element number of this element being processed as adjacent elements.

In cases in which the position at which the element being processed is arranged is not farther away from adjacent elements than the vertical and horizontal allowable spacing, allowable spacing calculation section 9 calculates coordinates of positions such that all allowable spacing is satisfied. Here, when allowable spacing calculation,section,9 calculates the position of the element being processed, the position of the element being processed is calculated while giving priority to keeping the allowable spacing with adjacent elements that have high priority by following the priorities described hereinafter.

First Priority: Priority is given to satisfying the allowable spacing with adjacent elements whose positions are specified.

To meet this condition in cases in which the element being processed is shifted, maximum limit shift amounts are stored in the shift aggregate data 72 such that the element does not come closer to the adjacent elements.

Second Priority: If the element being processed is the start element, priority is given to the starting position of the start element.

Third Priority: Priority is given to satisfying the allowable spacing with the adjacent elements that are arranged closest.

When the shift amounts of shift aggregate data 72 of these adjacent element are equal to the maximum limit shift amount in a direction away from the element being processed (i.e., when the adjacent elements cannot be moved away from the element being processed), allowable spacing calculation section 9 stores the maximum limit shift amount to shift aggregate data 72 of the element being processed such that adjacent elements cannot be moved closer.

Fourth Priority: Spacing with adjacent elements is ensured to be equal to or greater than the gap compensation amount added to the allowable spacing.

Allowable spacing calculation section 9 calculates the position of the element being processed by this type of method, and shifts the element being processed to that position. If allowable spacing calculation section 9 shifts the element being processed, it sets processing reservations for other elements belonging to the same shift aggregate group. Then, allowable, spacing calculation section 9 extracts adjacent elements for each shifted element, and sets process reservations for adjacent elements as well if the adjacent elements do not satisfy the allowable spacing with respect to the element being processed (Step 44).

After this process, allowable spacing calculation section 9 checks for the existence of a start element or an element that is reserved for processing and has still not been processed, and if such an element exists, again executes the process of Step 44. If no element exists that is reserved for processing and all elements stored as start elements have already been reset, allowable spacing calculation section 9 carries out the process of Step 46 (Step 45).

A concrete example of the processing of the above-described Steps 44 and 45 is next explained with reference to FIGS. 10a, 10b, and 10c. As shown in FIG. 10b, if via-hole J is to be added, this element becomes the start element, and via-hole J is therefore selected as the element to be processed in Step 44. In this case, via-holes I and K are selected as the adjacent elements. Here, none of via-holes I, J, and K are position-specified elements, but the position of terminal L is specified. In addition, allowable spacing is not achieved between via-holes I and J, and a space is provided between via-holes J and K that is equal to or greater than the gap compensation amount added to the allowable spacing.

In Step 44, in accordance with the conditions of the Second Priority when calculating the position of a element being processed that satisfies allowable spacing with respect to adjacent elements, the position of via-hole J is given priority, whereby the adjacent element via-hole I becomes a candidate for shifting and is reserved for processing. In Step 45, the element of via-hole I, which is reserved for processing, is detected, and the process of Step 44 taking via-hole I as the element to be processed is continued. This state is shown in FIG. 10c.

Figure 11C:
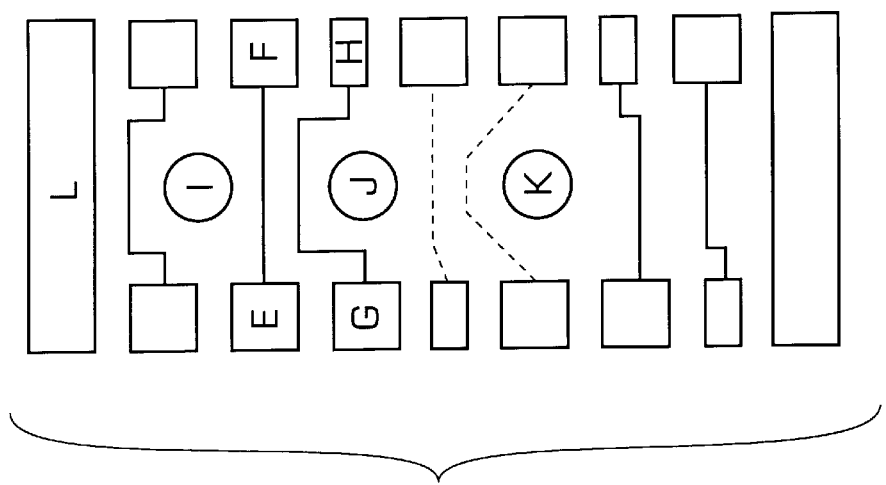
FIGS. 11a, 11b, and 11c show layout patterns for illustrating a concrete example of the procedures in the second embodiment according to the present invention.

However, because priority (First Priority) is given to having the position of process element I satisfy the allowable spacing with respect to adjacent element L, which has a specified position, the position of process element I is established at the position shown in FIG. 10c. As a result, a process reservation is set for via-hole J, which has become an adjacent element, to satisfy the allowable spacing between via-holes I and J. In the process of Step 45, via-hole J, for which a process reservation has been set, is detected, whereby the process of Step 44 is again resumed, and processing is carried out with via-hole J as the element being processed. Via-hole J is shifted to the position shown in FIG. 11a, and a process reservation is set for via-hole K, which is an adjacent element. Step 44 is then again resumed by way of Step 45, and if it is ascertained that via-hole K achieves allowable spacing with respect to adjacent elements, the processes of Steps 44 and 45 by section 6 for compacting within allowable spacing are completed.

After the positions of terminals and via-holes are thus confirmed, processing proceeds to Step 46 in which layout amendment specification section 5 shifts to a state of awaiting a command from the operator. Upon receiving a command from the operator to form wiring, layout amendment specification section 5 activates rewiring section 8 and the process of Step 46 is executed. In Step 46, wiring elements stored as element to be modified are selected one at a time as the element to be processed and the following process carried out.

Figure 11B:
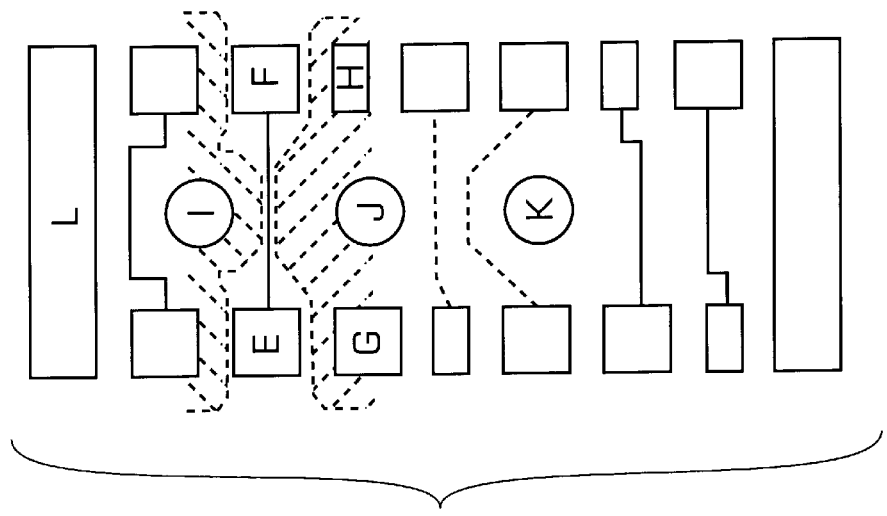
Figure 11A:
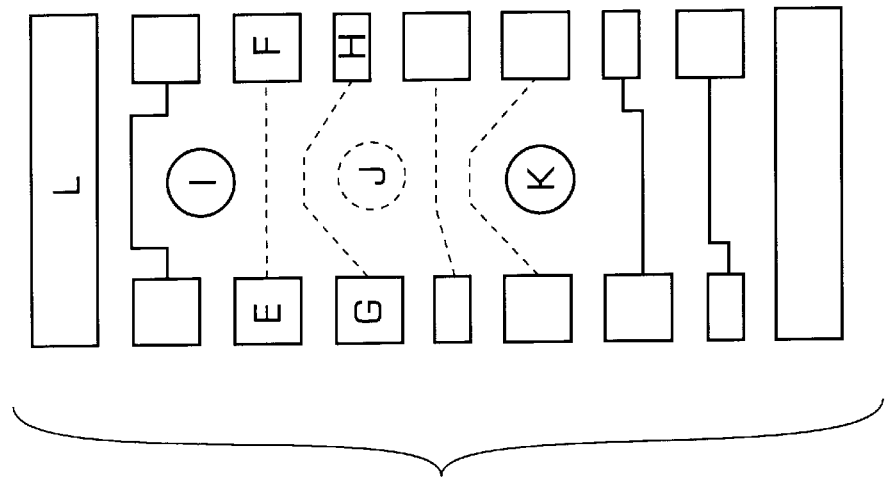

Rewiring section 8 extracts allowable spacing data 61 that stores the element being processed; calculates the total of the sum of the required minimum gap and the width of the wiring as far as the terminal or via-hole at the end of the element being processed, which is wiring, or as far as a wiring sub-element whose position is confirmed, and the radius of the end terminal or via-hole element or wiring sub-element; and makes this the allowable spacing from the wiring to the terminal or via-hole or wiring sub-element. The allowable spacing here means all of the vertical allowable spacing, the horizontal allowable spacing, and the allowable spacing in a 45ç diagonal direction. Rewiring section 8 then stores element numbers or sub-element numbers and the allowable spacing as far as the wiring to wiring vicinity data 74, which has the data structure shown in FIG. 12b. In FIG. 11b, the region within the allowable spacing in the wiring vicinity data 74 of the wiring that connects terminal E and terminal F is shown by a broken line.

Rewiring section 8 next routes the path of wiring in a position separated by a distance equal to or greater than the allowable spacing from the elements of the element numbers stored in wiring vicinity data 74, similar to the wiring connecting terminal E and terminal F in FIG. 11b. The subelements of wiring element data 14 are in this way confirmed. The width and margin of gaps are thus established for other as yet unprocessed wiring when a wiring path is confirmed, and as a result, a wiring path can be easily secured in the event of the subsequent addition of wiring that connects terminal G and terminal H as shown in FIG. 11c (Step 46).

As described in the foregoing explanation, when adding a terminal or via-hole to an already existing layout or when modifying the position of a terminal or via-hole in a layout in the present embodiment, only elements that do not satisfy allowable spacing are shifted and the spacing of all terminals and via-holes together is made equal to or greater than the allowable spacing.

The production of wiring lower-limit position data such as is used in the first embodiment thus becomes unnecessary in the present embodiment, and the capacity of the storage device for storing data can be accordingly reduced. The wiring compaction section 7 for producing wiring lowerlimit position data also becomes unnecessary and the processing time of the figure layout compaction device can also be reduced.

In addition, the position of arrangement of an element is calculated only when the arranged element interferes with another element, thereby allowing a further reduction in the processing time for calculating the position of arrangement of an element. By modifying a layout while restricting the elements whose positions are modified and not modifying the positions of other elements, the number of modification points can be reduced and the processing time can be further shortened. Moreover, by making the number of layout modification points the minimum necessary, this embodiment also has the advantage of allowing a reduction of the modifications of data of, for example, the results of a transmission line simulator or the results of a noise simulator.

In the present embodiment, the processing of Step 46 was performed by receiving instructions for wiring formation from the operator and carrying out the wiring process, but the wiring process may also be performed automatically without waiting for instructions from an operator.

(Third Embodiment)

FIG. 14 is a block diagram showing the third embodiment of a figure layout compaction device according to the present invention.

As shown in FIG. 14, the figure layout compaction device of this embodiment is made up of: display 105, layout data conversion section 106, compaction section 107, rewiring section 108, data storage section 114, and layout data storage section 112.

Display 105 is made up of, for example, a CRT display or liquid crystal display and is used for displaying an initial layout pattern, a layout pattern undergoing modification, a layout pattern following completion of modification, and layout data.

Here, layout patterns are made up of terminals, via-holes, wiring, and polygonal conductor shapes.

Layout data conversion section 106 disassembles via-holes for every layer surface, disassembles wiring at every bent and branch point of the wiring route, disassembles polygonal conductor shapes into each side, and produces element data which take as elements the terminals, disassembled via-holes, disassembled wiring, and the sides obtained by disassembling polygonal conductor shapes.

Identical shift aggregate numbers are conferred to each element for identical parts, identical via-holes, and identical polygonal conductor shapes. Layout data conversion section 106 then produces vertical ranking data and horizontal ranking data showing the vertical and horizontal relationship of adjacent elements.

Compaction section 107 produces vertical and horizontal sequence data that place all elements in vertical and horizontal order; and based on the vertical (or horizontal) rank of elements, shifts within the shift limit value of the shift aggregate group of the elements by pushing down (or up) or by pushing right (or left) the terminals, via-holes, or wiring. In cases in which wiring pushes against other elements when carrying out this shifting, a compaction process is carried out that bends and compacts. The position of wiring that has been thus bent and compacted is stored as wiring limit position data. After carrying out the processing that shifts these elements, compaction section 107 updates the shift limit values of the shift aggregate groups to which these elements belong.

After completion of the compaction process by compaction section 107, rewiring section 108 routes wiring through the blank region between the positions determined by the wiring limit data and positions separated by the allowable spacing from elements positioned in the direction opposite the direction of pushing.

Data storage section 113 stores the allowable spacing data.

Layout data storage section 112 stores the layout data.

Figure 15:
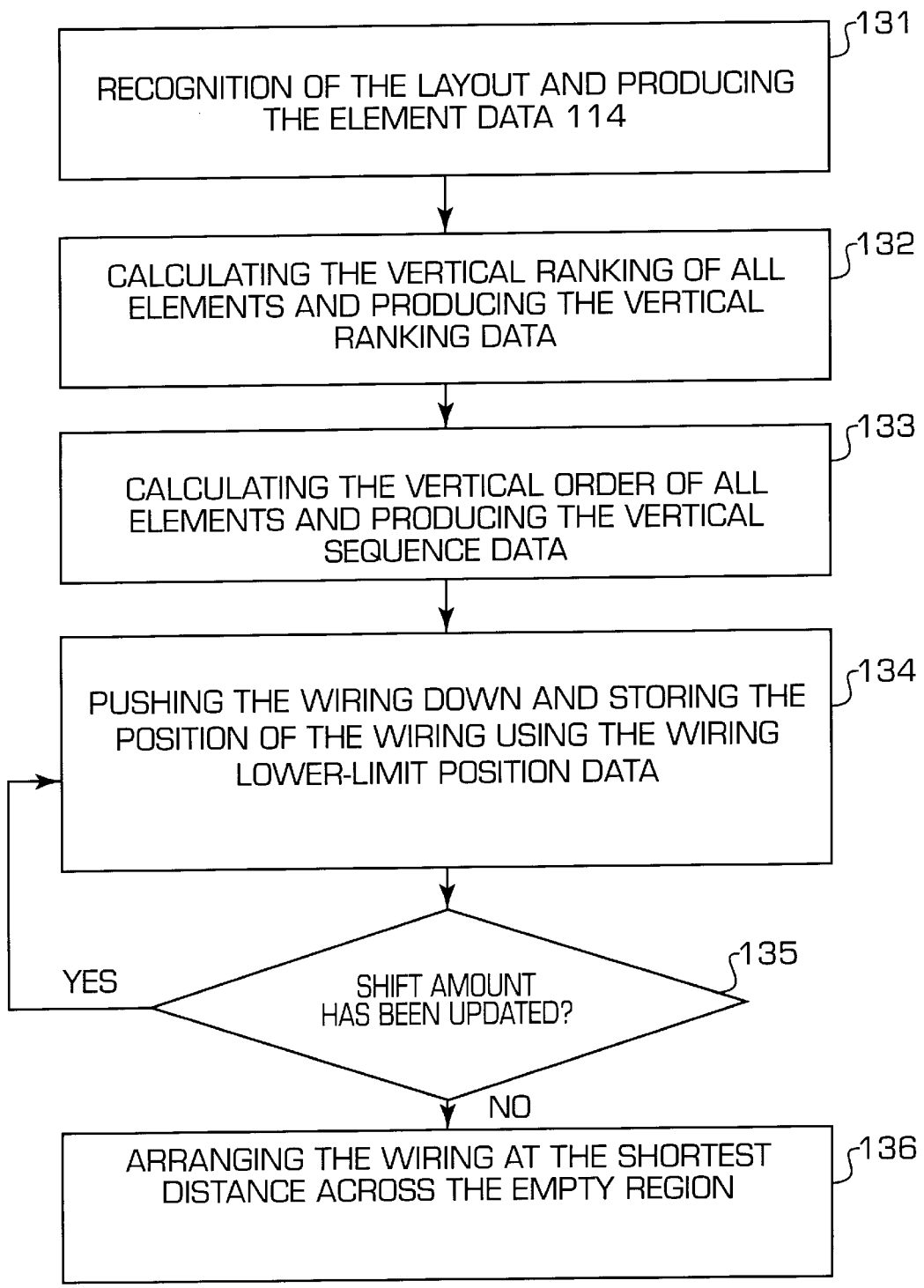
FIG. 15 is a flow chart showing the procedures in the third embodiment according to the present invention.

The operation of this embodiment is next explained with reference to the flow chart of FIG. 15.

Figure 16C:
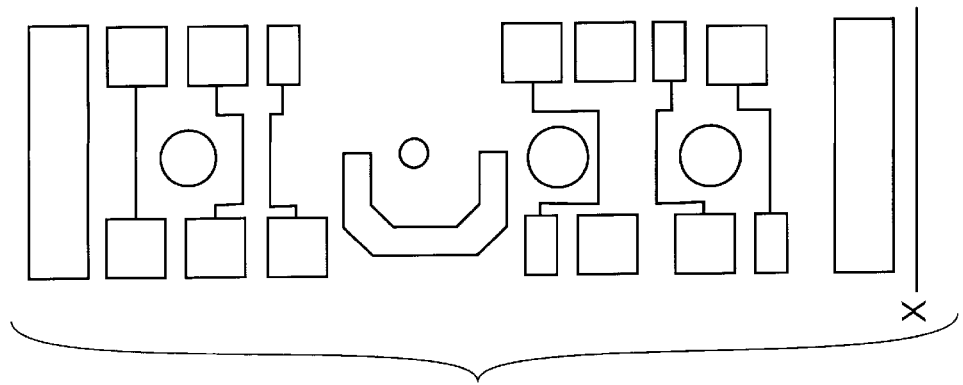
FIGS. 16a, 16b, and 16c show layout patterns for illustrating a concrete example of the procedures in the third embodiment according to the present invention.
Figure 16B:
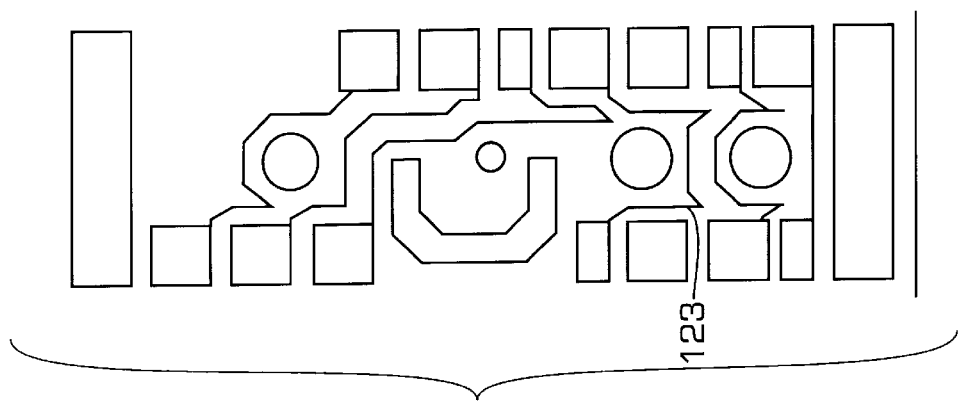
Figure 16A:
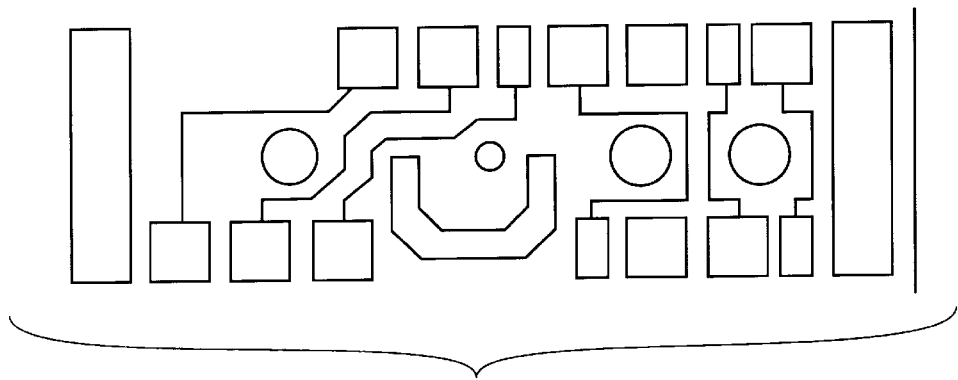

FIGS. 16*a*, 16*b*, and 16*c* are layout patterns showing a concrete example of the operation steps in the compaction process by the figure layout compaction device of this embodiment.

The initial layout of the printed circuit board shown in FIG. 16*a* is applicable despite having an arrangement in which the gaps between adjacent wiring, terminals, via-holes, and polygonal conductor shapes do not satisfy the minimum gap of the design rules, because gaps that are less than the minimum dimensions of these design rules are corrected in the steps of the process of this embodiment.

Layout data conversion section 106 first performs layout recognition for the layout data stored in layout data storage section 112 and produces element data 114 and 115 (Step 131).

FIGS. 17*a* and 17*b* show the data structure of produced element data 114 and 115.

Element data 114 exhibits the data structure of element data for terminals and via-holes, and is essentially element data 14 of FIG. 2*a* to which is additionally stored a shape number.

Element data 115 exhibits a data structure of element data for wiring and polygonal conductor shapes, and is essentially element data 15 of FIG. 2*b* to which is additionally stored a shape number.

A shape number is a number for indicating the shape of an element, and shape data 116 of a figure as shown in FIG. 17*c* are produced for each shape number.

In this shape data 116 of a figure are stored the shape number of a figure, the vertical width value, the horizontal width value, the diagonal width value in a 45-degree direction toward the upper right, and a diagonal width value in a 45-degree direction toward the lower right of a figure. By storing these values, layout data conversion section 106 can sense that the shape of a figure is an octagon.

The elements of a polygonal conductor shape are the fixed line segments for each side of a polygonal conductor shape, and these elements are treated similarly to the elements of wiring by taking these line segments as elements.

Layout data conversion section 106 next produces the element vertical ranking data 16 and element horizontal ranking data 16*a* shown in FIG. 2*c*, these data showing the vertical and horizontal relationships of adjacent elements to each other (Step 132).

Compaction section 107 next produces vertical sequence data 17 that places all elements in vertical order, as in the first embodiment described hereinbefore (Step 133).

Compaction section 107 next executes the compaction process on the wiring, terminals, and via-holes according to the processes of Step 134 to Step 136 described hereinafter.

Compaction section 107 first fixes the position of border line X of the region in which an element is arranged, fixes to a specified value the shift amounts of shift aggregate groups that incorporate terminal elements for parts whose positions are specified, and for other parts, via-holes, and shift aggregate groups that incorporate polygonal conductor shapes and wiring, sets infinity, which is the initial value, as the shift amount. Compaction section 107 then stores these shift amounts to shift aggregate data 22 having the data structure shown in FIG. 3*b*.

Compaction section 107 then selects terminal, via-hole, wiring, and polygonal conductor shape elements as the element to be processed one at a time in order from elements having a low rank stored in element vertical sequence data 17 to elements having a high rank, and carries out arrangement processing according to the procedures described below.

Compaction section 107 first extracts element vertical ranking data 16 containing the element being processed as an upper element and then arranges the element being processed close to the maximum limit of the lower element and within the shift amount that is set to the shift aggregate groups to which the element being processed belongs. When carrying out this shift, compaction section 107 updates the shift amount of the shift aggregate group to which the element being processed belongs. When shifting wiring, compaction section 107 arranges the wiring by bending the wiring to match the shape of the lower element and pushing the wiring down, and stores the position of the wiring as the wiring lower-limit position data (Step 134). FIG. 16b shows an example in which wiring lower-limit position data are represented as actual wiring.

After carrying out the process of Step 134, compaction section 107 checks for the existence of shift aggregate data 22 in which shift amounts have been updated (Step 135).

If updated shift aggregate data 22 exist, the process of Step 134 is again repeated. The process of arranging wiring, polygonal conductor shapes, and terminals as well as via-holes by pushing down is thus carried out by repeating the processing of Steps 134 and 135 a plurality of times. The shift amounts of all shift aggregate groups have been updated to appropriate values when updating of shift amounts in shift aggregate data 22 is no longer performed.

Rewiring section 108 next selects wiring elements as the elements to be processed one by one in order from elements having a high rank in vertical sequence data 17 to elements having a low rank and arranges each wiring element according to the following method: Rewiring section 108 extracts vertical ranking data 16 for the element having the element being processed as a lower element and reads the position of that upper element. Rewiring section 108 reads the wiring lower-limit position data and routes the wiring by the shortest distance across the blank region between a position separated from the upper element by the allowable spacing and a position stipulated by the wiring lower-limit position data (Step 136). FIG. 16c shows the results of the routing process by this method.

As explained hereinabove, the present embodiment enables a compaction process for patterns having diagonal shapes by dividing via-holes between elements in each layer, dividing polygonal conductor shapes into each of their sides, and dividing wiring into elements by each bent and branch point of the wiring route, thereby allowing the vertical relationship between each element to be defined without contradiction.

(Fourth Embodiment)

Explanation is next presented regarding the fourth embodiment of the figure layout compaction device of the present invention. Constituent elements bearing the same reference numeral in FIG. 14, FIGS. 17a, 17b, and 17c represent equivalent components.

The construction of this embodiment is equivalent to that of the third embodiment of the figure layout compaction device shown in FIG. 14.

Figure 18:
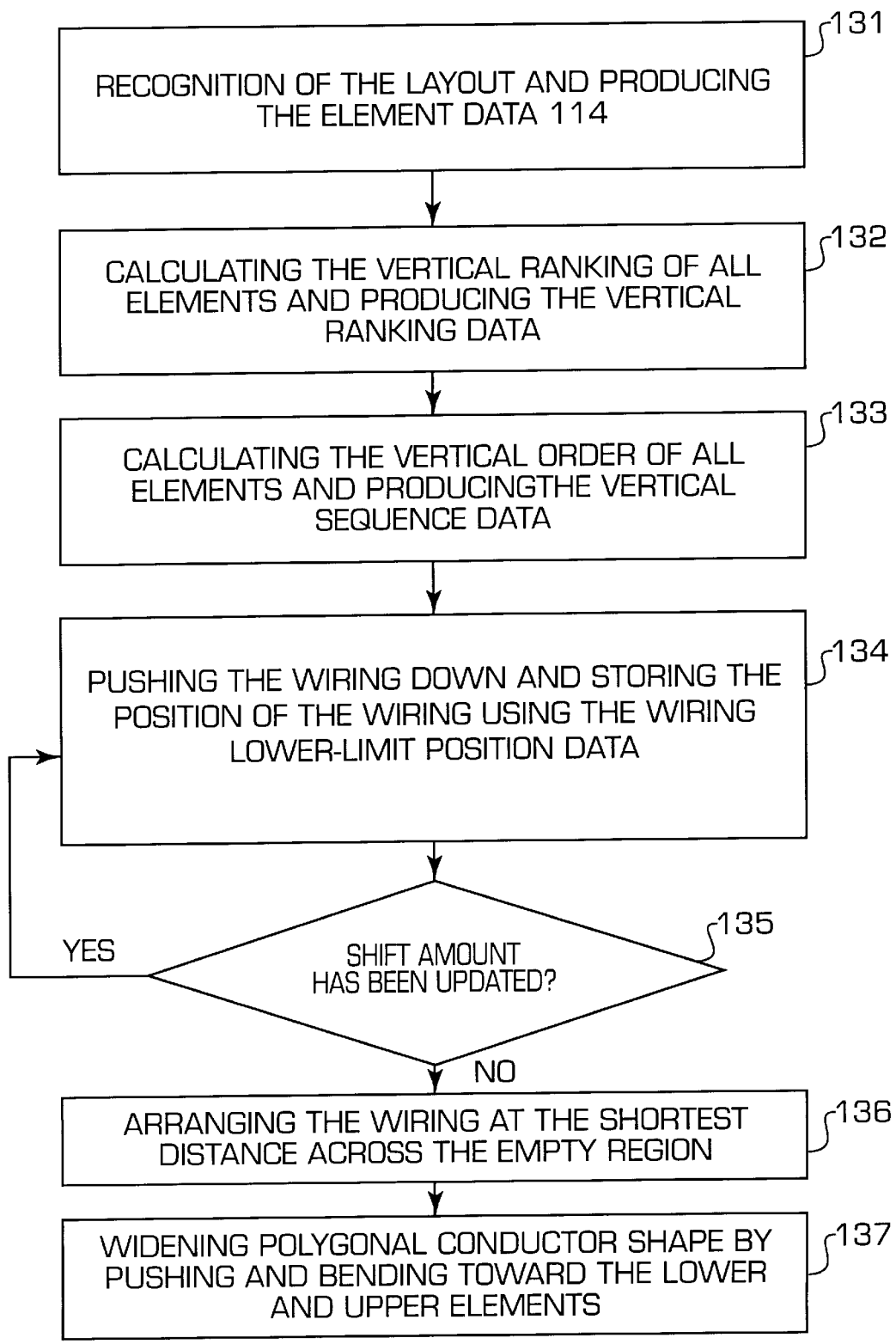
FIG. 18 is a flow chart showing the procedures in the fourth embodiment according to the present invention.

FIG. 18 is a flow chart for illustrating the operation of this embodiment.

Figure 19C:
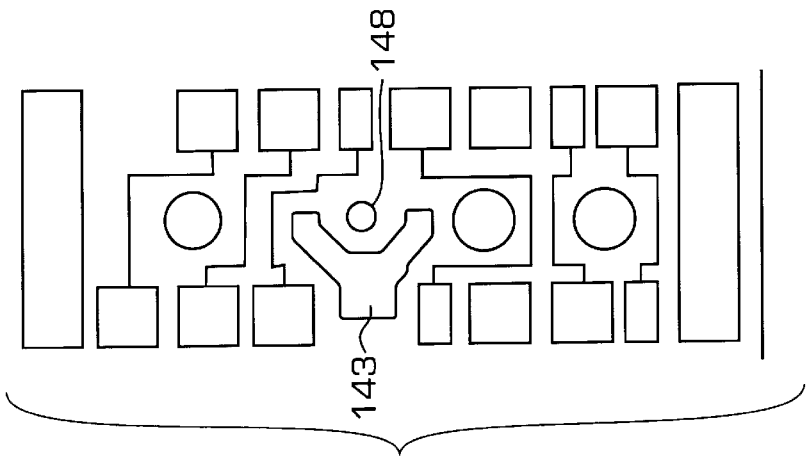
FIGS. 19a, 19b, and 19c show the data structures of each type of data in the fourth embodiment according to the present invention.
Figure 19B:
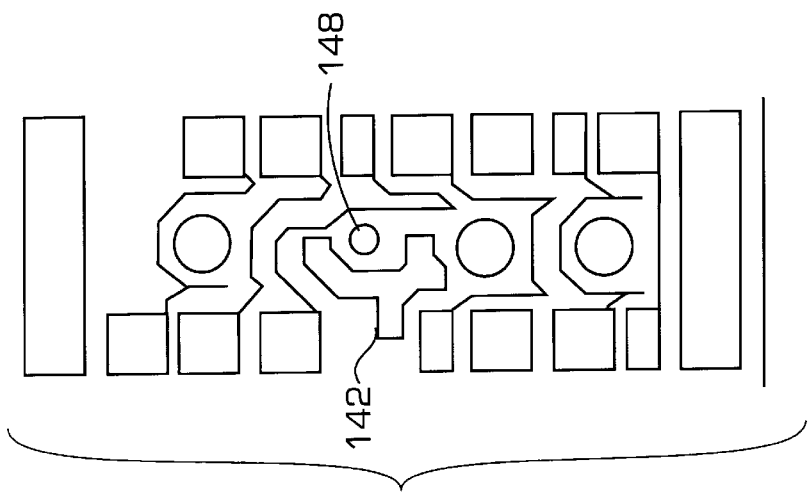
Figure 19A:
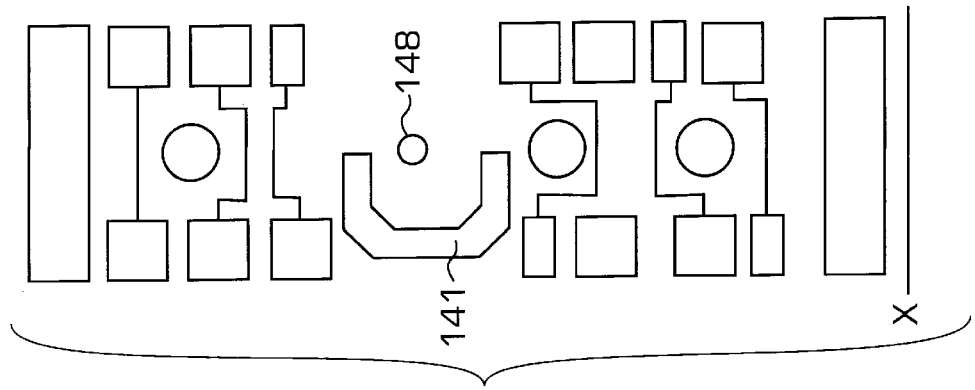

FIGS. 19a, 19b, and 19c are layout patterns illustrating concrete examples of the stages of operation of the comp( action process by the figure layout compaction device of this embodiment. In FIG. 19a, which shows the layout pattern before the compaction process, polygonal conductor shape 141 is disposed in a form that encloses terminal 148.

First, layout data conversion section 106 carries out layout recognition of the layout data stored in layout data storage section 112 and produces element data (Step 131).

Here, the element data of terminals and via-holes are stored in the structure of element data 114 shown in FIG. 17a, and element data for wiring and polygonal conductor shapes are stored in the structure of element data 144 shown in FIG. 20a and sub-element data 145 shown in FIG. 20b.

Element data 144 and sub-element data 145 are equivalent to element data 64 and sub-element data 64a in the second embodiment shown in FIGS. 13a, and 13b, to which a shape number has been stored.

In addition, the polygonal conductor shapes are divided into line segments having the minimum necessary width, thus allowing modification of shape by representation using the line segment data. In other words, each side of a polygonal conductor shape is replaced by a line segment such that the exterior may overlap with the polygonal conductor shape. The line segment data are sub-elements, and are stored in the data structure of sub-element data 145 shown in FIG. 20b. In element data 144, the coordinate values of the left ends of these line segments are stored as the first end coordinate values, and the coordinate values of the right ends are stored as the second end coordinate values. In addition, when a polygonal conductor shape has a concavity opening toward the left, the position of the left end of this concavity is taken as the reference for position, the concavity is divided into three portions: a right side portion, an upper left portion, and a lower left portion, and element data 144 are produced for each portion. For the case of a concavity opening toward the right as well, an equivalent process is carried out in which left and right are exchanged in the above-described method.

Here, the start storage address of a sub-element data group need not be stored in element data 144 of a polygonal conductor shape. In this case, the shape of the polygonal conductor shape is unspecified. In the same way, the starting storage address of a sub-element data group need not be stored in wiring element data 144.

The processing of Steps 132 to 136 is carried out as in the third embodiment described hereinabove. In this case, compaction section 107 treats a polygonal conductor shape as a single linked line. As a result, polygonal conductor shape 141 shown in FIG. 19a is converted in FIG. 19b and becomes the linear form of polygonal conductor shape 142.

Finally, rewiring section 108 widens polygonal conductor shape 142 by pushing and bending toward the lower and upper elements such that its borderline reaches positions that are separated from the lower and upper elements by the allowable spacing, thereby obtaining polygonal conductor shape 143 that covers a widespread region as shown in FIG. 19c (Step 137). widening This embodiment has the advantage of enabling free modification of a polygonal conductor shape to a shape that corresponds to the pattern compaction process.

In the above-described first to fourth embodiments, the via-holes may pass through all layers of a printed circuit board, or may pass through only a portion.

In the above-described first to fourth embodiments, explanation has been presented for cases employing printed circuit boards, but the present invention is not limited to such cases and may also be applied to semiconductor integrated circuits, in which case, the terminals of the components correspond to terminals provided in cells or blocks.

While preferred embodiments of the present invention have been described using specific terms, such description is for illustrative purposes only, and it is to be understood that changes and variations may be made without departing from the spirit or scope of the following claims.

What is claimed is:

1. An element layout compaction device comprising:
   a layout change device for issuing an order to change a layout, for disassembling wiring, terminals and via-holes into elements, for assigning an identical shift aggregate number to all elements associated with terminals in a component, or each element associated with a via-hole to form a shift aggregate group, and for producing vertical ranking data indicative of the ranking of each of said elements in a vertical direction and horizontal ranking data indicative of the ranking of each of said elements in a horizontal direction;

an allowable spacing calculator for producing vertical sequence data indicative of the order of each of said elements in the vertical direction from said vertical ranking data, and for producing horizontal sequence data indicative of the order of each of said elements in the horizontal direction from said horizontal ranking data, and for calculating an allowable spacing between terminals or via-holes and other adjacent terminals or via-holes;

a compactor having a means for shifting and arranging said terminals and via-holes within said allowable spacing so that said terminals and via-holes may be packed in any of an upward direction, a downward direction, a leftward direction and a rightward direction, and for adding a relative limit amount of shift to a shift amount of the shift aggregate the upper neighboring element belongs to, to obtain a maximum limit amount of shift of the shift aggregate the element under processing belongs to, said relative limit amount of shift being an amount of shift in which the lower neighboring element can approach the upper neighboring element with an allowable spacing, for updating the current shift amount of the shift aggregate the element under processing belongs to, by said maximum limit amount, if the latter is below the former, to sequentially update the shift amounts of elements smaller values from infinity which is the initial value, for shifting and arranging each elements belonging same shift aggregate group together, and for moving terminals and via-holes continuously until a predetermined condition is satisfied to rearrange said terminals and via-holes such that a gap is maintained between said terminals and via-holes and said adjacent terminals and via-holes that can accommodate at least one wire;

a wiring compactor for arranging said wiring so that they may be packed in any of the upward direction, the downward direction, the leftward direction and the rightward direction;

a rewirer for repositioning said wiring to a position separated by at least the allowable spacing from adjacent elements;

a layout data storage device for storing layout data; and an allowable-spacing data storage device for storing the allowable spacing of said terminals and via-holes.

2. An element layout compaction method comprising the steps of:

disassembling wiring, terminals, and via-holes of inputted layout data into elements;

assigning an identical shift aggregate number to all elements associated with terminals in a component, and to each element of a via-hole to form a shift aggregate group;

producing vertical ranking data indicative of the ranking of each of said elements in a vertical direction and horizontal ranking data indicative of the ranking of each of said elements in the horizontal direction;

producing vertical sequence data indicative of the order of each of said elements in a vertical direction from said vertical ranking data, and producing horizontal sequence data indicative of the order of each of said elements in the horizontal direction from said horizontal ranking data;

calculating allowable spacing between terminals or via-holes and other adjacent terminals or via-holes;

adding a relative limit amount of shift to a shift amount of the shift aggregate the upper neighboring element belongs to, to obtain a maximum limit amount of shift of the shift aggregate the element under processing belongs to, said relative limit amount of shift being an amount of shift in which the lower neighboring element can approach the upper neighboring element with an allowable spacing, for updating the current shift amount of the shift aggregate the element under processing belongs to, by said maximum limit amount, if the latter is below the former, to sequentially update the shift amounts of elements smaller values from infinity which is the initial value, for shifting and arranging each elements belonging same shift aggregate group together to shift and arrange said terminals and via-holes within said allowable spacing so that said terminals and via-holes may be packed in any of an upward direction, a downward direction, a leftward direction and a rightward direction;

moving terminals and via-holes continuously until a predetermined condition is satisfied to rearrange said terminals and via-holes such that a gap is maintained between said terminals and via-holes and said adjacent terminals and via-holes that can accommodate at least one wire;

positioning said wiring to new position so that said wiring may be packed in any of an upward direction, a downward direction, a leftward direction, and a right ward direction, and storing said new positions as wiring limit position data; and arranging said wiring in accordance with the shortest distance across a blank region defined by a first position of an element existing on a side opposite the direction of a movement of said wiring and a second position determined from said wiring limit position data, wherein the distance between said first and second position is in accordance with said allowable spacing.

3. An element layout compaction method according to claim 2, further including the steps of:

disassembling wiring, terminals, and via-holes of inputted layout data into elements and storing said elements, and storing elements of wiring, terminals and via-holes that are added or whose positions are modified as start elements;

producing vertical ranking data based on updated layout data indicative of the ranking of each of said elements in the vertical direction and horizontal ranking data indicative of the ranking of each of said elements in the horizontal direction;

calculating allowable spacing between terminals and via-holes and adjacent terminals and via-holes;

shifting a terminal or via-hole stored as said start element, or shifting an element that must be shifted due to the provision of said start element, to a position separated from other adjacent terminals and via-holes by at least said allowable spacing, and whenever possible, by said allowable spacing supplemented by an amount that is large enough to accommodate at least one wire; and arranging wiring to a position separated from other adjacent elements by said allowable spacing or more.

4. An element layout compaction device comprising:

a layout data converter for dividing a plurality of terminals and via-holes in inputted layout data into elements, for dividing wiring and polygonal conductor shapes into elements for each bent point and branch point of the wiring route, for appending a common shift aggregate number to element data of all elements that must be shifted together, and for producing vertical ranking data indicative of the vertical ranking of each of said elements in the vertical direction and horizontal ranking data indicative of the horizontal ranking of each of said elements in the horizontal direction;

a compactor for producing vertical sequence data indicative of the order of each of said elements in the vertical direction form said vertical ranking data, and for producing horizontal sequence data indicative of the order of each of said elements from said horizontal ranking data, and shifting and arranging said terminals and via-holes so that said terminals and via-holes may be packed in any of an upward direction, downward direction, a leftward direction, and a rightward direction based on said vertical sequence data and said horizontal sequence data, and for updating limit amount of shift of shift aggregate groups to which each of said elements belongs when shifting each of said elements; and a rewirer after completion of the compaction process by said compactor, for routing wiring through the blank region between the positions determined by the wiring limit data and positions separated by the allowable spacing from elements positioned in the direction opposite the direction of pushing.

5. An element layout compaction method comprising:

a first step for dividing terminals and via-holes in inputted layout data into elements, dividing wiring and polygonal conductor shapes into elements for every bent point and branch point of the wiring route, and assigning a common shift aggregate number to element data of all elements that must be shifted together;

a second step for producing vertical ranking data indicative of the rank of each of said elements in the vertical direction and horizontal ranking data indicative of the ranking of each of said elements in the horizontal direction;

a third step for producing vertical sequence data indicative of the order of each of said elements in the vertical direction form said vertical ranking data;

a fourth step for producing horizontal sequence data indicative of the horizontal order of each of said elements in the horizontal direction from said horizontal ranking data;

a fifth step for performing compaction process so that said elements may be packed in any of an upward direction, downward direction, leftward direction, and rightward direction based on said vertical sequence data and said horizontal sequence data;

a sixth step for updating limit amount of shift of shift aggregate groups to which each of said elements belongs when shifting each of said elements; and a seventh step for, after completion of said compaction process, routing wiring through the blank region between the positions determined by the wiring limit data and positions separated by the allowable spacing from elements positioned in the direction opposite the direction of pushing.

6. An element layout compaction method according to claim 5, wherein:

said first step includes the step of using an octagonal shape as the polygonal conductor shape, and for using an element number, a shape number of a figure, coordinate values and shift aggregate number as said element data;

said second step includes the step of storing said vertical ranking data wherein a vertical border line serves as a reference for vertical ranking, and storing said horizontal ranking data wherein a horizontal border line serves as a reference for horizontal ranking; and said sixth step includes the step of producing shift aggregate data for elements other than elements whose positions are fixed, said shift aggregate data being made up of said shift aggregate number and the shift amount of elements to which said shift aggregate number is appended, and successively updating said shift amounts such that each of said elements is arranged as close as possible to the limit amount of shift.

7. An element layout compaction method according to claim 5, further including steps for storing the limit amount of shift of each of said elements as limit position data, and arranging wiring at the shortest distance across a blank region between said limit amount of shift and other adjacent elements.

8. An element layout compaction method according to claim 7, wherein:

said first step includes the step of using an octagonal shape as the polygonal conductor shape, and for using an element number, a shape number of a figure, coordinate values and shift aggregate number as said element data;

said second step includes the step of storing said vertical ranking data wherein a vertical border line serves as a reference for vertical ranking, and storing said horizontal ranking data wherein a horizontal border line serves as a reference for horizontal ranking; and said sixth step includes the step of producing shift aggregate data for elements other than elements whose positions are fixed, said shift aggregate data being made up of said shift aggregate number and the shift amount of elements to which said shift aggregate number is appended, and successively updating said shift amounts such that each of said elements is arranged as close as possible to the limit amount of shift.

9. An element layout compaction method according to claim 7, further including a step wherein, in cases in which a polygonal conductor shape is included as said element, said polygonal conductor shape is converted into a more expansive shape by causing the border line of said polygonal conductor shape to approach other elements adjacent to said polygonal conductor shape.

10. An element layout compaction method according to claim 9, wherein:

said first step includes the step of using an octagonal shape as the polygonal conductor shape, and for using an element number, a shape number of a figure, coordinate values and shift aggregate number as said element data;

said second step includes the step of storing said vertical ranking data wherein a vertical border line serves as a reference for vertical ranking, and storing said horizontal ranking data wherein a horizontal border line serves as a reference for horizontal ranking; and said sixth step includes the step of producing shift aggregate data for elements other than elements whose positions are fixed, said shift aggregate data being made up of said shift aggregate number and the shift amount of elements to which said shift aggregate number is appended, and successively updating said shift amounts such that each of said elements is arranged as close as possible to the limit amount of shift.

* * * * *